(12) United States Patent
Wen et al.

(10) Patent No.: US 12,254,157 B2
(45) Date of Patent: Mar. 18, 2025

(54) TOUCH DISPLAY PANEL AND ELECTRONIC PRODUCT

(71) Applicant: BOE Technology Group Co., Ltd., Beijing (CN)

(72) Inventors: Mengyang Wen, Beijing (CN); Jianchao Zhu, Beijing (CN); Guangliang Shang, Beijing (CN); Xinbin Han, Beijing (CN); Ziyang Yu, Beijing (CN); Pan Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/274,204

(22) PCT Filed: Jul. 12, 2022

(86) PCT No.: PCT/CN2022/105176
§ 371 (c)(1),
(2) Date: Jul. 25, 2023

(87) PCT Pub. No.: WO2024/011406
PCT Pub. Date: Jan. 18, 2024

(65) Prior Publication Data
US 2025/0021199 A1    Jan. 16, 2025

(51) Int. Cl.
*G06F 3/044* (2006.01)

(52) U.S. Cl.
CPC .......... *G06F 3/0445* (2019.05); *G06F 3/0448* (2019.05); *G06F 2203/04107* (2013.01)

(58) Field of Classification Search
CPC ................. G06F 3/0445; G06F 3/0448; G06F 2203/041; G06F 3/04103; G02F 1/13338
See application file for complete search history.

(56) References Cited

U.S. PATENT DOCUMENTS

| | | | |
|---|---|---|---|
| 11,169,406 B2 * | 11/2021 | An | G06F 3/047 |
| 11,239,303 B2 * | 2/2022 | Li | H10K 77/111 |
| 2016/0378224 A1 * | 12/2016 | Kwon | H10K 59/1315 345/174 |

(Continued)

FOREIGN PATENT DOCUMENTS

CN    107092400 A  *  8/2017  ......... G02F 1/13338

*Primary Examiner* — Rodney Amadiz
(74) *Attorney, Agent, or Firm* — Banner & Witcoff, Ltd.

(57) ABSTRACT

A touch display panel and an electronic product. The touch display panel includes a display substrate, a first conductive layer, a touch insulation layer, a second electrode layer, and a shielding conductive pattern; the display substrate includes a signal line, a first electrode layer and a second electrode layer; the first conductive layer includes a touch conductive structure, which includes touch electrodes, the first electrode layer includes first electrodes, and the second electrode layer includes a plurality of second electrodes; an orthographic projection of the shielding conductive pattern on the base substrate overlaps with that of the signal line and that of at least one of the plurality of touch electrodes respectively, the shielding conductive pattern is located in the first conductive layer and insulated from the touch conductive structure, or the shielding conductive pattern is located in the second electrode layer and insulated from the second electrode.

20 Claims, 18 Drawing Sheets

(56) References Cited

U.S. PATENT DOCUMENTS

| | | | |
|---|---|---|---|
| 2020/0333916 A1* | 10/2020 | Zhang | G06F 3/0443 |
| 2022/0276744 A1* | 9/2022 | Bo | G06F 3/0446 |
| 2024/0053855 A1* | 2/2024 | Fang | G06F 3/044 |
| 2024/0397798 A1* | 11/2024 | Li | H10K 59/122 |

* cited by examiner

TOUCH DISPLAY PANEL AND ELECTRONIC PRODUCT

The application is a U.S. National Phase Entry of International Application No. PCT/CN2022/105176 filed Jul. 12, 2022, designating the United States of America. The present application claims priority to and the benefit of the above-identified application and the above-identified application is incorporated by reference herein in its entirety.

TECHNICAL FIELD

Embodiments of the present disclosure relate to a touch display panel and electronic product.

BACKGROUND

Touch display panel is a kind of display panel that allows users to realize various operations by gently touching icons or characters with their fingers, thus getting rid of input devices such as keyboard and mouse operation and making human-computer interaction more straightforward.

Touch display panel integrates display function and touch function. Organic Light Emitting Diode (OLED) display technology has been more and more used in various electronic products because of its advantages of self-luminescence, wide viewing angle, high contrast, low power consumption and high response speed. The touch function can adopt various touch technologies such as resistance, capacitance, infrared, surface acoustic wave and optics.

SUMMARY

Embodiments of the present disclosure provide a touch display panel and an electronic product. A shielding conductive pattern insulated from the touch conductive structure is arranged in the first conductive layer, and the orthographic projection of the shielding conductive pattern on the base substrate overlaps with the orthographic projection of the signal line on the base substrate and the orthographic projection of at least one touch electrode on the base substrate respectively, so that the shielding conductive pattern shields the signal line and the touch electrode. The touch display panel can also be provided with the shielding conductive pattern insulated from the second electrode (e.g. cathode) in the second electrode layer, and the orthographic projection of the shielding conductive pattern on the base substrate overlaps with the orthographic projection of the signal line on the base substrate and the orthographic projection of at least one touch electrode on the base substrate respectively, so that the shielding conductive pattern can shield the signal line and the touch electrode. Therefore, by arranging the shielding conductive pattern on the first conductive layer or the second electrode layer, the shielding effect of the shielding conductive pattern on the signal line and the touch electrode can be realized, the crosstalk between the signal line and the touch electrode can be reduced, the touch signal-to-noise ratio can be improved, and the display effect can be improved. There is no need to additionally add a separate shielding conductive pattern and a mask process for forming the shielding conductive pattern, so that the manufacturing cost and manufacturing cycle can be saved, a thickness of the touch display panel is not increased, and the flexibility and variability of the touch display panel are improved. Meanwhile, the shielding conductive pattern insulated from the touch conductive structure is arranged on the first conductive layer, which can further improve the bad phenomena of metal visibility, water ripples and metal diffraction stripes between the first conductive layer and the second conductive layer, and further improve the display effect.

At least one embodiment of the present disclosure provides a touch display panel, which includes: a display substrate, including a base substrate; a signal line, located on the base substrate; a first electrode layer, located on a side of the signal line away from the base substrate; and a second electrode layer, located on a side of the first electrode layer away from the base substrate, a first conductive layer, located on the display substrate; a touch insulation layer, located on a side of the first conductive layer away from the display substrate; and a second conductive layer, located on a side of the touch insulation layer away from the first conductive layer, the first conductive layer includes a touch conductive structure, the second conductive layer includes a plurality of touch electrodes, the first electrode layer includes a plurality of first electrodes, and the second electrode layer includes a plurality of second electrodes; the touch display panel further includes a shielding conductive pattern, wherein an orthographic projection of the shielding conductive pattern on the base substrate overlaps with an orthographic projection of the signal line on the base substrate and an orthographic projection of at least one of the plurality of touch electrodes on the base substrate respectively, the shielding conductive pattern is located in the first conductive layer and insulated from the touch conductive structure, or the shielding conductive pattern is located in the second electrode layer and insulated from the second electrode.

For example, in the touch display panel provided by an embodiment of the present disclosure, the shielding conductive structure is located in the first conductive layer and insulated from the touch conductive structure, the orthographic projection of the signal line on the base substrate and the orthographic projection of at least one of the plurality of touch electrodes on the base substrate have a first overlapping region, in the first overlapping region, the orthographic projection of the shielding conductive pattern on the base substrate overlaps with the orthographic projection of the signal line on the base substrate and an orthographic projection of the plurality of touch electrodes on the base substrate respectively.

For example, in the touch display panel provided by an embodiment of the present disclosure, outside the first overlapping region, the orthographic projection of the shielding conductive pattern on the base substrate overlaps with the orthographic projection of the plurality of touch electrodes on the base substrate.

For example, in the touch display panel provided by an embodiment of the present disclosure, the orthographic projection of the touch conductive structure on the base substrate and the orthographic projection of at least one of the plurality of touch electrodes on the base substrate have a second overlapping region, outside the second overlapping region, the orthographic projection of the shielding conductive pattern on the base substrate completely overlaps with the orthographic projection of the plurality of touch electrodes on the base substrate.

For example, in the touch display panel provided by an embodiment of the present disclosure, the shielding conductive pattern is a first metal mesh, including a first metal mesh line and a plurality of first hollows surrounded by the first metal mesh line; the touch conductive structure is a second metal mesh, including a second metal mesh line and a plurality of second hollows surrounded by the second metal mesh line; each of the plurality of touch electrode is a third metal mesh, including a third metal mesh line and a plurality of third hollows surrounded by the third metal mesh line.

For example, in the touch display panel provided by an embodiment of the present disclosure, an orthographic projection of at least part of the first metal mesh line on the base substrate overlaps the orthographic projection of the signal line on the base substrate and an orthographic projection of the third metal mesh line of at least one of the plurality of touch electrodes on the base substrate respectively.

For example, in the touch display panel provided by an embodiment of the present disclosure, the display substrate further includes a plurality of pixel units, and the first metal mesh line, the second metal mesh line and the third metal mesh line are arranged outside effective display regions of the plurality of pixel units.

For example, in the touch display panel provided by an embodiment of the present disclosure, the plurality of pixel units are divided into a plurality of first pixel groups, and each of the plurality of first pixel groups includes one first pixel unit, one second pixel unit and one third pixel unit, one first pixel group is arranged within the first hollow; and/or one first pixel group is arranged within the second hollow; and/or one first pixel group is arranged within the third hollow.

For example, in the touch display panel provided by an embodiment of the present disclosure, the plurality of pixel units are divided into a plurality of second pixel groups, and each of the plurality of second pixel groups includes one first pixel unit, two second pixel units and one third pixel unit, one second pixel group is arranged within the first hollow; and/or one second pixel group is arranged within the second hollow; and/or one second pixel group is arranged within the third hollow.

For example, in the touch display panel provided by an embodiment of the present disclosure, the first pixel unit is configured to emit red light, the second pixel unit is configured to emit green light, and the third pixel unit is configured to emit blue light.

For example, in the touch display panel provided by an embodiment of the present disclosure, an orthographic projection of the first hollow on the base substrate is rectangular; and/or an orthographic projection of the second hollow on the base substrate is rectangular; and/or an orthographic projection of the third hollow on the base substrate is rectangular.

For example, in the touch display panel provided by an embodiment of the present disclosure, the orthographic projection of the first hollow on the base substrate is hexagonal; and/or the orthographic projection of the second hollow on the base substrate is hexagonal; and/or the orthographic projection of the third hollow on the base substrate is hexagonal.

For example, in the touch display panel provided by an embodiment of the present disclosure, each of the plurality of pixel unit includes: a pixel driving circuit, located on the base substrate; and a light emitting layer, located between the first electrode layer and the second electrode layer, the first electrode is an anode, the second electrode is a cathode, the signal line is configured to provide a driving signal to the pixel driving circuit, and the pixel driving circuit is electrically connected with the anode and configured to drive the light emitting layer to emit light.

For example, in the touch display panel provided by an embodiment of the present disclosure, the signal line includes at least one selected from the group consisting of a gate line, a data line and a reset line.

For example, in the touch display panel provided by an embodiment of the present disclosure, the plurality of touch electrodes include a plurality of first touch electrodes and a plurality of second touch electrodes; the plurality of first touch electrodes are arranged along a first direction, each of the plurality of first touch electrode extends along a second direction intersecting with the first direction, and each of the plurality of first touch electrode includes a plurality of touch electrode portions arranged along the second direction and a connection portion positioned between two adjacent touch electrode portions; the plurality of second touch electrodes are arranged along the second direction, each of the plurality of second touch electrode includes a plurality of touch electrode blocks arranged along the first direction, and two adjacent touch electrode blocks in the first direction are electrically connected through the touch conductive structure.

For example, in the touch display panel provided by an embodiment of the present disclosure, each of the touch electrode blocks and each of the touch electrode portions are both diamond-shaped metal meshes.

For example, in the touch display panel provided by an embodiment of the present disclosure, the plurality of touch electrodes are arranged in an array along a first direction and a second direction; the touch conductive structure includes a plurality of touch signal lines, the plurality of touch signal lines are correspondingly arranged with the plurality of touch electrodes, and each of the plurality of touch signal line is electrically connected with a corresponding touch electrode.

For example, in the touch display panel provided by an embodiment of the present disclosure, the shielding conductive pattern is located in the second electrode layer and insulated from the second electrode, the orthographic projection of the signal line on the base substrate and the orthographic projection of at least one of the plurality of touch electrodes on the base substrate have a third overlapping region, in the third overlapping region, the orthographic projection of the shielding conductive pattern on the base substrate overlaps with the orthographic projection of the signal line on the base substrate and an orthographic projection of the touch electrodes on the base substrate respectively.

For example, the touch display panel provided by an embodiment of the present disclosure further includes: an encapsulation layer, located between the display substrate and the first conductive layer; an anti-reflective layer, located on a side of the second conductive layer away from the display substrate; and a cover plate, located on a side of the anti-reflective layer away from the display substrate.

At least one embodiment of the present disclosure further provides an electronic product, which includes any one of the abovementioned touch display panel.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

FIG. 5b is a schematic wiring view of a first conductive layer of the touch display panel in FIG. 5a;

FIG. 5c is a schematic wiring view of a second conductive layer of the touch display panel in FIG. 5a;

FIG. 5g is a partially enlarged schematic view of a dashed line region M in FIG. 5a FIG. 5h is a partially enlarged schematic view of a pixel group of FIG. 5a;

FIG. 6b is a schematic wiring view of a second conductive layer of the touch display panel corresponding to FIG. 6a;

FIG. 6c is a partially enlarged schematic view of a dashed line region H in FIG. 6a;

FIG. 6d is an enlarged schematic view of a touch conductive structure of the first conductive layer in FIG. 6a;

FIG. 6g is a schematic view of a pixel unit arrangement of the touch display panel corresponding to FIG. 6a;

FIG. 9b is a partially enlarged schematic view of a dashed line region Z in FIG. 9a;

DETAILED DESCRIPTION

Figure 1:
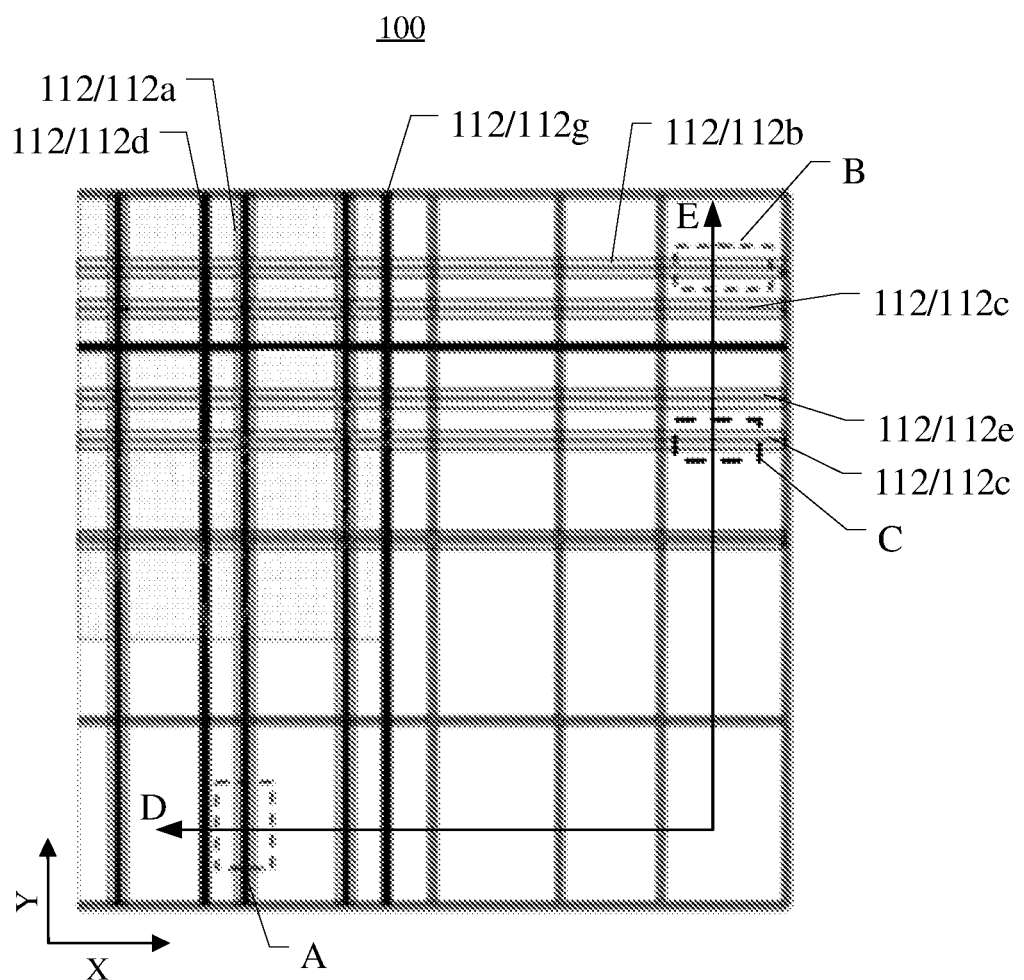
FIG. 1 is a schematic plan view of a touch display panel provided by an embodiment of the present disclosure.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "include," "including," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. The terms "up," "down," "left," "right," and the like, are used to indicate relative positional relationships, which may change accordingly when the absolute position of the described object changes.

The various components or structures shown in the drawings are not strictly drawn to scale. For clarity purposes, the dimensions of these components or structures may be exaggerated or reduced, but such variations should not be construed as limiting the scope of this disclosure. To maintain clarity and conciseness of the following description of the embodiments of the present disclosure, detailed descriptions of known functions and components may be omitted.

In order to reduce a thickness of a touch display panel and improve the touch performance, a touch structure can be directly formed on a display panel, but a distance between the touch structure and various signal lines on the display panel is relatively close. On the other hand, in order to increase the transmittance of touch display panel, a cathode in an ordinary touch display panel is patterned. In a hollow region of the cathode pattern, display signal lines (such as data lines, gate lines, reset lines, etc.) can be coupled with the touch structure, resulting in mutual interference between the display signal lines and the touch structure.

For example, a frequency of the gate line of the display panel is 50 kHZ to 150 kHZ, and a scanning frequency of a touch electrode signal is 50 kHZ to 300 kHZ, so that the gate line and the touch electrode are coupled and interfere with each other. Especially in the trend that the touch display panel becomes thinner and thinner, the touch structure is only 20 µm away from a driving circuit of the display panel, and the crosstalk becomes stronger, which leads to the problem of abnormal display or touch failure. Meanwhile, for the touch structure with single-layer bridge design, the touch electrode layer and the touch conductive structure layer of the touch structure have a situation of uneven distribution of metal mesh, which will lead to the undesirable phenomena of visible metal mesh, water ripples and metal diffraction stripes at the touch conductive structure.

Therefore, embodiments of the present disclosure provide a touch display panel and an electronic product. The touch display panel includes a display substrate, a first conductive layer, a touch insulation layer and a second conductive layer. The display substrate includes a substrate, signal lines, a first electrode layer and a second electrode layer; the signal lines are located on the base substrate, the first electrode layer is located on a side of the signal line away from the base substrate, and the second electrode layer is located on a side of the first electrode layer away from the base substrate; the first conductive layer is located on the display substrate; the touch insulation layer is located on a side of the first conductive layer away from the display substrate; the second conductive layer is located on a side of the touch insulation layer away from the first conductive layer. The first conductive layer includes a touch conductive structure, the second conductive layer includes a plurality of touch electrodes, the first electrode layer includes a plurality of first electrodes, and the second electrode layer includes a plurality of second electrodes. The touch display panel further includes a shielding conductive pattern, and an orthographic projection of the shielding conductive pattern on the base substrate overlaps with an orthographic projection of the signal line on the base substrate and an orthographic projection of at least one of the plurality of touch electrodes on the base substrate respectively. The shielding conductive pattern is located in the first conductive layer and insulated from the touch conductive structure, or the shielding conductive pattern is located in the second electrode layer and insulated from the second electrode.

According to the touch display panel, the shielding conductive pattern insulated from the touch conductive structure is arranged on the first conductive layer, and the orthographic projection of the shielding conductive pattern on the base substrate overlaps with the orthographic projection of the signal line and the orthographic projection of at least one touch electrode on the base substrate respectively, so that the shielding conductive pattern shields the signal line and the touch electrode. The touch display panel can also be provided with the shielding conductive pattern insulated from the second electrode (e.g. cathode) on the second electrode layer, and the orthographic projection of the shielding conductive pattern on the base substrate overlaps with the orthographic projection of the signal line and the orthographic projection of at least one touch electrode on the base substrate respectively, so that the shielding conductive pattern can shield the signal line and the touch electrode. Therefore, by arranging the shielding conductive pattern on the first conductive layer or the second electrode layer, the shielding effect of the shielding conductive pattern on the signal line and the touch electrode can be realized, the crosstalk between the signal line and the touch electrode can be reduced, the touch signal-to-noise ratio can be improved, and the display effect can be improved. There is no need to additionally add a separate shielding conductive pattern and a mask process for forming the shielding conductive pattern, so that the manufacturing cost and manufacturing cycle can be saved, a thickness of the touch display panel is not increased, and the flexibility and variability of the touch display panel are improved. Meanwhile, the shielding conductive pattern insulated from the touch conductive structure is arranged on the first conductive layer, which can further improve the bad phenomena of metal visibility, water ripples and metal diffraction stripes between the first conductive layer and the second conductive layer, and further improve the display effect.

Hereinafter, the touch display panel and the electronic product provided by the embodiments of the present disclosure will be described in detail with reference to the accompanying drawings.

Figure 2A:
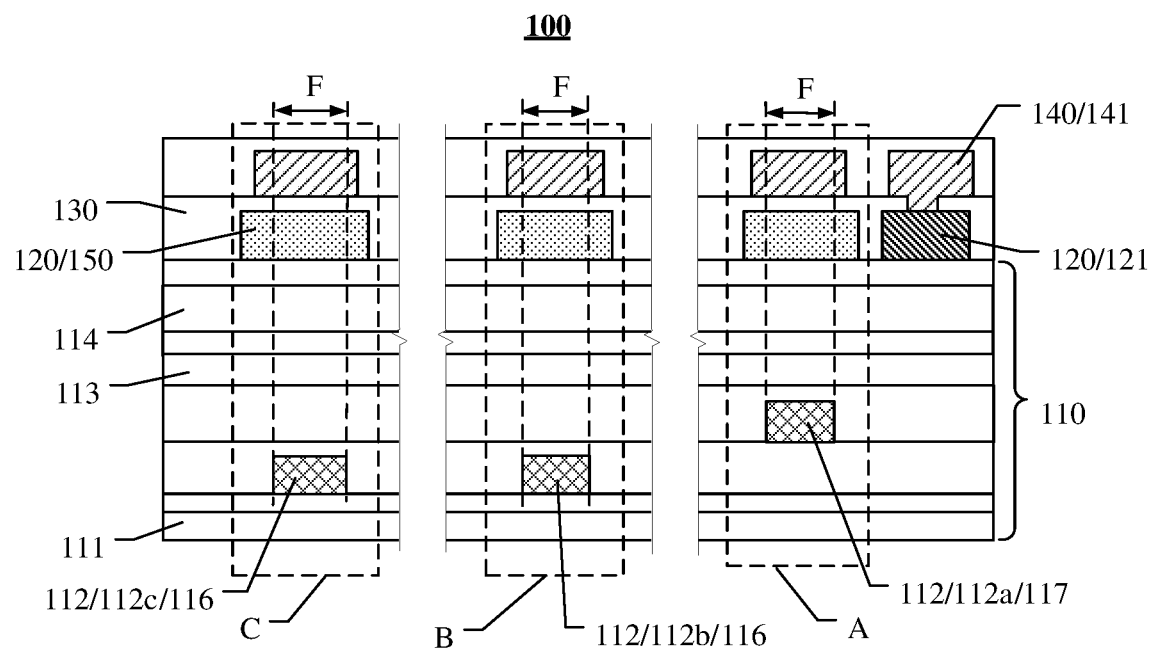
FIG. 2a is a schematic sectional view along a section line DE in FIG. 1.

An embodiment of the present disclosure provides the touch display panel. FIG. 1 is a schematic plan view of a touch display panel provided by an embodiment of the present disclosure; FIG. 2a is a schematic sectional view along a section line DE in FIG. 1. As illustrated by FIGS. 1 and 2a, the touch display panel 100 includes a display substrate 110, a first conductive layer 120, a touch insulation layer 130 and a second conductive layer 140. The display substrate 110 includes a base substrate 111 and signal lines 112; the signal lines 112 are located on the base substrate 111; the first conductive layer 120 is located on the display substrate 110; the touch insulation layer 130 is located on a side of the first conductive layer 120 away from the display substrate 110. The second conductive layer 140 is located on a side of the touch insulation layer 130 away from the first conductive layer 120. The first conductive layer 120 includes a touch conductive structure 121, and the second conductive layer 140 includes a plurality of touch electrodes 141. The touch display panel 100 further includes a shielding conductive pattern 150, and an orthographic projection of the shielding conductive pattern 150 on the base substrate 111 overlaps with an orthographic projection of the signal line 112 and an orthographic projection of at least one of the plurality of touch electrodes 141 on the base substrate 111 respectively. The shielding conductive pattern 150 is located in the first conductive layer 120 and insulated from the touch conductive structure 121. In addition, the display substrate 110 may further include a first electrode layer 113 and a second electrode layer 114, the first electrode layer 113 is located on a side of the signal line 112 away from the base substrate 111, and the second electrode layer 114 is located on a side of the first electrode layer 113 away from the base substrate 111. Refer to the following FIGS. 4a and 4b for relevant illustrations.

In the touch display panel 100 provided by the embodiment of the present disclosure, the shielding conductive pattern 150 can be disposed on the first conductive layer 120 and insulated from the touch conductive structure 121, and the orthographic projection of the shielding conductive pattern 150 on the base substrate 111 overlaps with the orthographic projection of the signal line 112 and the orthographic projection of at least one of the plurality of touch electrodes 141 on the base substrate 111 respectively, so that the shielding conductive pattern 150 shields the signal line 112 and the touch electrode 141. Therefore, by arranging the shielding conductive pattern 150 on the first conductive layer 120, the shielding effect of the shielding conductive pattern 150 on the signal line 112 and the touch electrode 141 can be realized, the crosstalk between the signal line 112 and the touch electrode 141 can be reduced, the touch signal-to-noise ratio can be improved, and the display effect can be improved. There is no need to additionally add a separate shielding conductive pattern 150 and a mask process for forming the shielding conductive pattern 150, so that the manufacturing cost and manufacturing cycle can be saved, a thickness of the touch display panel 100 will not be increased, and the flexibility and variability of the touch display panel 100 can be improved. Meanwhile, the shielding conductive pattern 150 insulated from the touch conductive structure 121 is arranged on the first conductive layer 120, which can further improve the metal visibility problems, water ripples and metal diffraction stripes between the first conductive layer 120 and the second conductive layer 140, and further improve the display effect.

In some examples, as illustrated by FIGS. 1 and 2a, the orthographic projection of the signal line 112 on the base substrate 111 and the orthographic projection of at least one of the plurality of touch electrodes 141 on the base substrate 111 have a first overlapping region F. In the first overlapping region F, the orthographic projection of the shielding conductive pattern 150 on the base substrate 111 overlaps with the orthographic projection of the signal line 112 on the base substrate 111 and the orthographic projection of the touch electrode 141 on the base substrate 111 respectively. Therefore, the shielding conductive pattern 150 can shield the signal line 112 and the touch electrode 141 in the first overlapping region F where the signal line 112 and the touch electrode 141 overlap, thereby better improving the shielding efficiency, and further improving the touch performance and display performance of the touch display panel 100.

For example, as illustrated by FIGS. 1 and 2a, the orthographic projections of the signal lines 112 on the base substrate 111 and the orthographic projections of the plurality of touch electrodes 141 on the base substrate 111 have first overlapping regions F. In the first overlapping region F, the orthographic projection of the shielding conductive pattern 150 on the base substrate 111 overlaps with the orthographic projection of the signal line 112 on the base substrate 111 and the orthographic projection of the touch electrode 141 on the base substrate 111 respectively.

In some examples, as illustrated by FIGS. 1 and 2a, outside the first overlapping region F, the orthographic projection of the shielding conductive pattern 150 on the base substrate 111 overlaps with the orthographic projection of the touch electrode 141 on the base substrate 111. Therefore, the shielding conductive pattern 150 can better shield the touch electrode 141 outside the first overlapping region F, thereby improving the touch performance and display performance of the touch display panel 100.

For example, as illustrated by FIGS. 1 and 2a, the shielding conductive patterns 150 are connected with each other.

For example, as illustrated by FIGS. 1 and 2a, the shielding conductive pattern 150 can be connected with a constant potential signal. For example, the shielding conductive pattern 150 may be grounded or have a constant potential of −2.4 V.

For example, as illustrated by FIGS. 1 and 2a, the signal line 112 may include at least one selected from the group consisting of a data line 112a, a gate line 112b, and a reset line 112c. For example, the gate line 112b and the reset line 112c may be located in a gate layer 116, the data line 112a may be located in a conductive layer 117, and the conductive layer 117 is located on a side of the gate layer 116 away from the base substrate 111. Of course, embodiments of the present disclosure include but are not limited thereto, and the gate line 112b and the reset line 112c may be located in different gate layers 116.

For example, the signal line 112 may further include a power supply line 112d, a light emission control line 112e, and an initialization line 112g. For example, the power supply line 112d may be located in the conductive layer 117 and the light emission control line 112e may be located in the gate layer 116. Of course, embodiments of the present disclosure include but are not limited thereto, and different signal lines 112 may also be located in different gate layers 116 or different conductive layers 117, respectively.

Figure 2B:
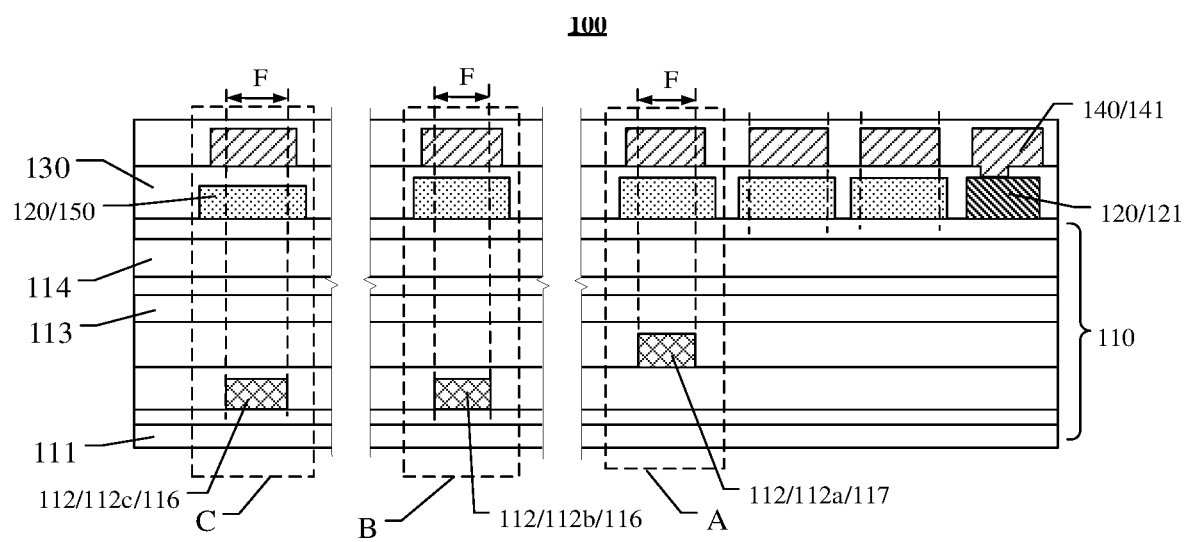
FIG. 2b is another schematic sectional view along the section line DE in FIG. 1 provided by an embodiment of the present disclosure.

FIG. 2b is another schematic sectional view along the section line DE in FIG. 1 provided by an embodiment of the present disclosure. As illustrated by FIG. 2b, the orthographic projections of the signal lines 112 on the base substrate 111 and the orthographic projections of the plurality of touch electrodes 141 on the base substrate 111 have first overlapping regions F. In the first overlapping region F, the orthographic projection of the shielding conductive pattern 150 on the base substrate 111 overlaps with the orthographic projection of the signal line 112 and the orthographic projection of the touch electrode 141 on the base substrate 111 respectively. Outside the first overlapping region F, the orthographic projection of the shielding conductive pattern 150 on the base substrate 111 overlaps with the orthographic projection of the touch electrode 141 on the base substrate 111. Therefore, the shielding conductive pattern 150 can better shield the touch electrode 141 outside the first overlapping region F, thereby improving the touch performance and display performance of the touch display panel 100.

For example, as illustrated by FIG. 2b, the orthographic projection of the shielding conductive pattern 150 on the base substrate 111 can cover the orthographic projection of the signal line 112 and the orthographic projection of the touch electrode 141 on the base substrate 111 respectively in a width direction, so that the shielding effect of the shielding conductive pattern 150 on the signal line 112 and the touch electrode 141 can be better realized. It should be noted that the above-mentioned "width direction" refers to a direction perpendicular to an extending direction of the shielding conductive pattern 150.

Figure 3A:
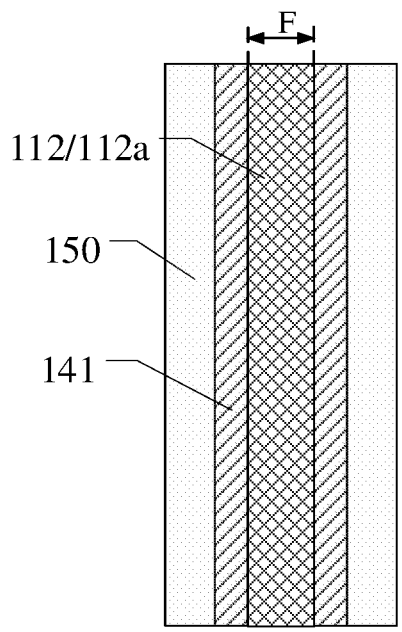
FIG. 3a is a partially enlarged schematic view of a dashed line region A in FIG. 1.
Figure 3B:
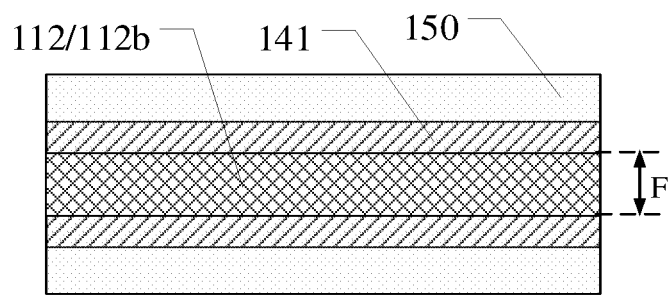
FIG. 3b is a partially enlarged schematic view of a dashed line region B in FIG. 1.
Figure 3C:
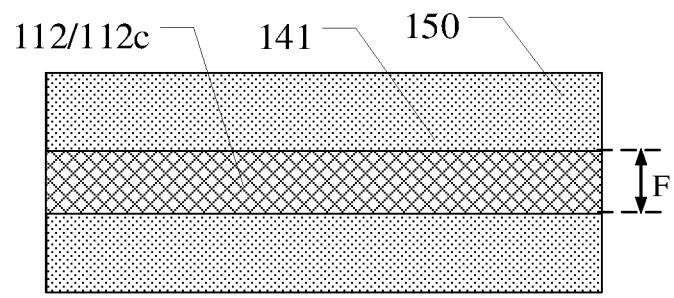
FIG. 3c is a partially enlarged schematic view of a dashed line region C in FIG. 1.

FIG. 3a is a partially enlarged schematic view of a dashed line region A in FIG. 1; FIG. 3b is a partially enlarged schematic view of a dashed line region B in FIG. 1; FIG. 3c is a partially enlarged schematic view of a dashed line region C in FIG. 1. For example, as illustrated by FIGS. 1 and 3a, the signal line 112 can be the data line 112a extending along a second direction Y. As illustrated by FIGS. 1 and 3b, the signal line 112 can be the gate line 112b extending along a first direction X. As illustrated by FIGS. 1 and 3c, the signal line 112 may be the reset line 112c extending in the first direction X. As illustrated by FIGS. 3a to 3c, the shielding conductive pattern 150 is located between the signal line 112 and the touch electrode 141, and the orthographic projection of the shielding conductive pattern 150 on the base substrate 111 overlaps with the orthographic projection of the signal line 112 and the orthographic projection of the touch electrode 141 on the base substrate 111 respectively. Therefore, the shielding effect of the shielding conductive pattern 150 on the signal line 112 and the touch electrode 141 can be realized, the crosstalk between the signal line 112 and the touch electrode 141 can be reduced, the touch signal-to-noise ratio can be improved, and the display effect can be improved.

For example, as illustrated by FIGS. 3a to 3c, the orthographic projection of the signal line 112 on the base substrate 111 and the orthographic projection of the touch electrode 141 on the base substrate 111 have the first overlapping region F. In the first overlapping region F, the orthographic projection of the shielding conductive pattern 150 on the base substrate 111 overlaps with the orthographic projection of the signal line 112 and the orthographic projection of the touch electrode 141 on the base substrate 111 respectively.

In some examples, as illustrated by FIGS. 3a to 3c, outside the first overlapping region F, the orthographic projection of the shielding conductive pattern 150 on the base substrate 111 overlaps with the orthographic projection of the touch electrode 141 on the base substrate 111. Therefore, the shielding conductive pattern 150 can better shield the touch electrode 141 outside the first overlapping region F, thereby improving the touch performance and display performance of the touch display panel 100.

For example, as illustrated by FIGS. 3a to 3c, the orthographic projection of the shielding conductive pattern 150 on the base substrate 111 can cover the orthographic projection of the signal line 112 and the orthographic projection of the touch electrode 141 on the base substrate 111 respectively in the width direction, so that the shielding effect of the shielding conductive pattern 150 on the signal line 112 and the touch electrode 141 can be better realized. It should be noted that the above-mentioned "width direction" refers to the direction perpendicular to the extending direction of the shielding conductive pattern 150.

Figure 4A:
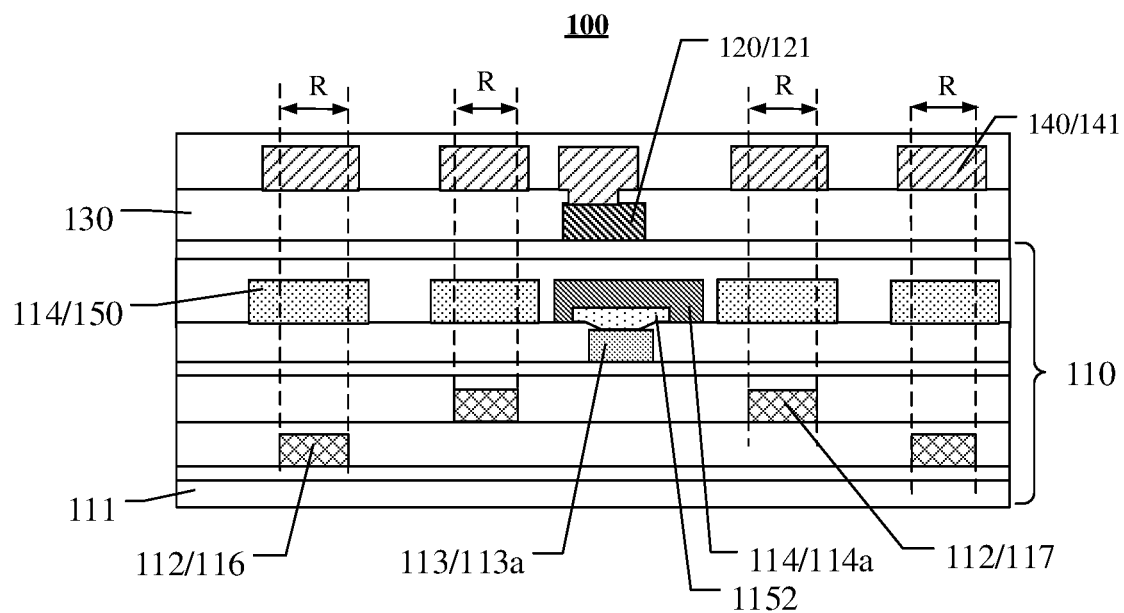
FIG. 4a is a schematic sectional view of another touch display panel provided by an embodiment of the present disclosure.

FIG. 4a is a schematic sectional view of another touch display panel provided by an embodiment of the present disclosure. As illustrated by FIG. 4a, the touch display panel 100 includes the display substrate 110, the first conductive layer 120, the touch insulation layer 130 and the second conductive layer 140. The display substrate 110 includes the base substrate 111, signal lines 112, the first electrode layer 113 and the second electrode layer 114. The signal lines 112 are located on the base substrate 111, the first electrode layer 113 is located on the side of the signal line 112 away from the base substrate 111, and the second electrode layer 114 is located on the side of the first electrode layer 113 away from the base substrate 111. The first conductive layer 120 is located on the side of the display substrate 110 close to the second electrode layer 114. The touch insulation layer 130 is located on the side of the first conductive layer 120 away from the display substrate 110. The second conductive layer 140 is located on the side of the touch insulation layer 130 away from the first conductive layer 120. The first conductive layer 120 includes the touch conductive structure 121, the second conductive layer 140 includes the plurality of touch electrodes 141, the first electrode layer 113 includes a plurality of first electrodes 113a, and the second electrode layer 114 includes a plurality of second electrodes 114a. The touch display panel 100 further includes the shielding conductive pattern 150, and the orthographic projection of the shielding conductive pattern 150 on the base substrate 111 overlaps with the orthographic projection of the signal line 112 and the orthographic projection of at least one of the plurality of touch electrodes 141 on the base substrate 111 respectively. The shielding conductive pattern 150 is located in the second electrode layer 114 and insulated from the second electrode 114a.

In the touch display panel 100 provided by the embodiment of the present disclosure, the shielding conductive pattern 150 is arranged on the second electrode layer 114 and insulated from the second electrode 114a, and the orthographic projection of the shielding conductive pattern 150 on the base substrate 111 overlaps with the orthographic projection of the signal line 112 on the base substrate 111 and the orthographic projection of at least one touch electrode 141 on the base substrate 111 respectively, so that the shielding conductive pattern 150 shields the signal line 112 and the touch electrode 141. Therefore, by arranging the shielding conductive pattern 150 on the second electrode layer 114, the shielding effect of the shielding conductive pattern 150 on the signal line 112 and the touch electrode 141 can be realized, the crosstalk between the signal line and the touch electrode can be reduced, the touch signal-to-noise ratio can be improved, and the display effect can be improved. There is no need to additionally add a separate shielding conductive pattern 150 and a mask process for forming the shielding conductive pattern 150, so that the manufacturing cost and manufacturing cycle can be saved, and the thickness of the touch display panel 100 will not be increased, and the flexibility and variability of the touch display panel 100 can be improved.

In some examples, as illustrated by FIGS. 1 and 4a, the orthographic projection of the signal line 112 on the base substrate 111 and the orthographic projection of at least one of the plurality of touch electrodes 141 on the base substrate 111 have a third overlapping region R. In the third overlapping region R, the orthographic projection of the shielding conductive pattern 150 on the base substrate 111 overlaps with the orthographic projection of the signal line 112 on the base substrate 111 and the orthographic projection of the touch electrode 141 on the base substrate 111 respectively. Therefore, the shielding conductive pattern 150 can shield the signal line 112 and the touch electrode 141 in the third overlapping region R where the signal line 112 and the touch electrode 141 overlap, so as to better improve the shielding efficiency and further improve the touch performance and display performance of the touch display panel 100.

For example, as illustrated by FIGS. 1 and 4a, the orthographic projections of the signal lines 112 on the base substrate 111 and the orthographic projections of the plurality of touch electrodes 141 on the base substrate 111 have the third overlapping regions R. In the third overlapping region R, the orthographic projection of the shielding conductive pattern 150 on the base substrate 111 overlaps with the orthographic projection of the signal line 112 on the base substrate 111 and the orthographic projection of the touch electrodes 141 on the base substrate 111 respectively.

In some examples, as illustrated by FIGS. 1 and 4a, outside the third overlapping region R, the orthographic projection of the shielding conductive pattern 150 on the base substrate 111 overlaps with the orthographic projection of the touch electrode 141 on the base substrate 111. Therefore, the shielding conductive pattern 150 can better shield the touch electrode 141 outside the third overlapping region R, thereby improving the touch performance and display performance of the touch display panel 100.

For example, as illustrated by FIGS. 1 and 4a, the orthographic projection of the shielding conductive pattern 150 on the base substrate 111 can cover the orthographic projection of the signal line 112 and the orthographic projection of the touch electrode 141 on the base substrate 111 respectively in the width direction, so that the shielding effect of the shielding conductive pattern 150 on the signal line 112 and the touch electrode 141 can be better realized. It should be noted that the above-mentioned "width direction" refers to the direction perpendicular to the extending direction of the shielding conductive pattern 150.

For example, as illustrated by FIG. 4a, the first electrode 113a can be an anode and the second electrode 114a can be a cathode, and a light emitting layer 1152 is disposed between the anode and the cathode.

Figure 4B:
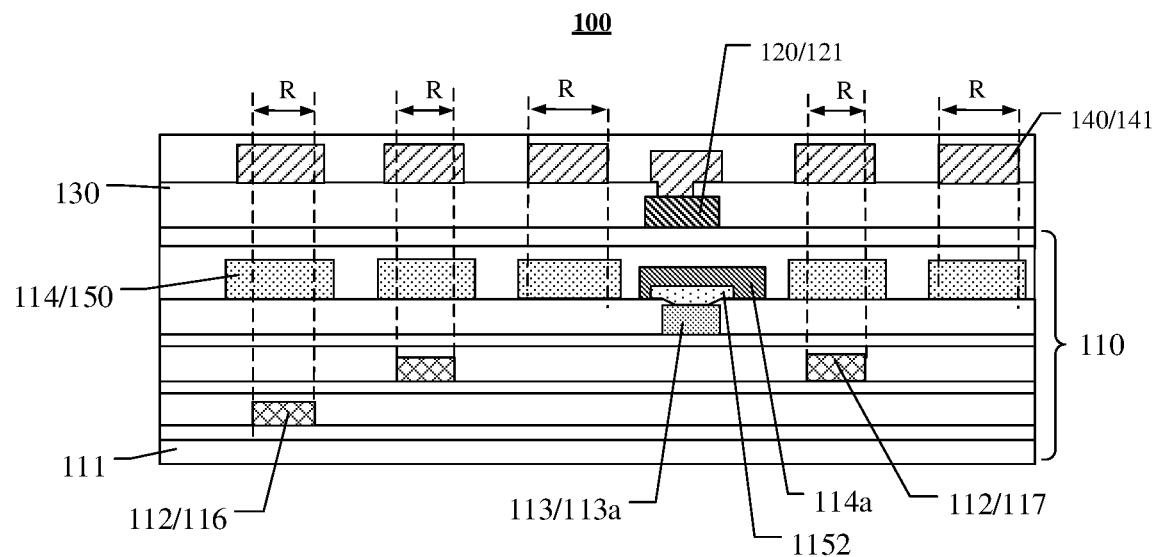
FIG. 4b is a schematic sectional view of another touch display panel provided by an embodiment of the present disclosure.

FIG. 4b is a schematic sectional view of another touch display panel provided by an embodiment of the present disclosure. As illustrated by FIG. 4b, the orthographic projections of the signal lines 112 on the base substrate 111 and the orthographic projections of the plurality of touch electrodes 141 on the base substrate 111 have third overlapping regions R. In the third overlapping region R, the orthographic projection of the shielding conductive pattern 150 on the base substrate 111 overlaps with the orthographic projection of the signal line 112 on the base substrate 111 and the orthographic projection of the touch electrodes 141 on the base substrate 111 respectively. Outside the third overlapping region R, the orthographic projection of the shielding conductive pattern 150 on the base substrate 111 overlaps with the orthographic projection of the touch electrode 141 on the base substrate 111. Therefore, the shielding conductive pattern 150 can better shield the touch electrode 141 outside the third overlapping region R, thereby improving the touch performance and display performance of the touch display panel 100.

For example, as illustrated by FIG. 4b, the orthographic projection of the shielding conductive pattern 150 on the base substrate 111 can cover the orthographic projection of the signal line 112 and the orthographic projection of the touch electrode 141 on the base substrate 111 respectively in the width direction, so that the shielding effect of the shielding conductive pattern 150 on the signal line 112 and the touch electrode 141 can be better realized. It should be noted that the above-mentioned "width direction" refers to the direction perpendicular to the extending direction of the shielding conductive pattern 150.

Figure 5A:
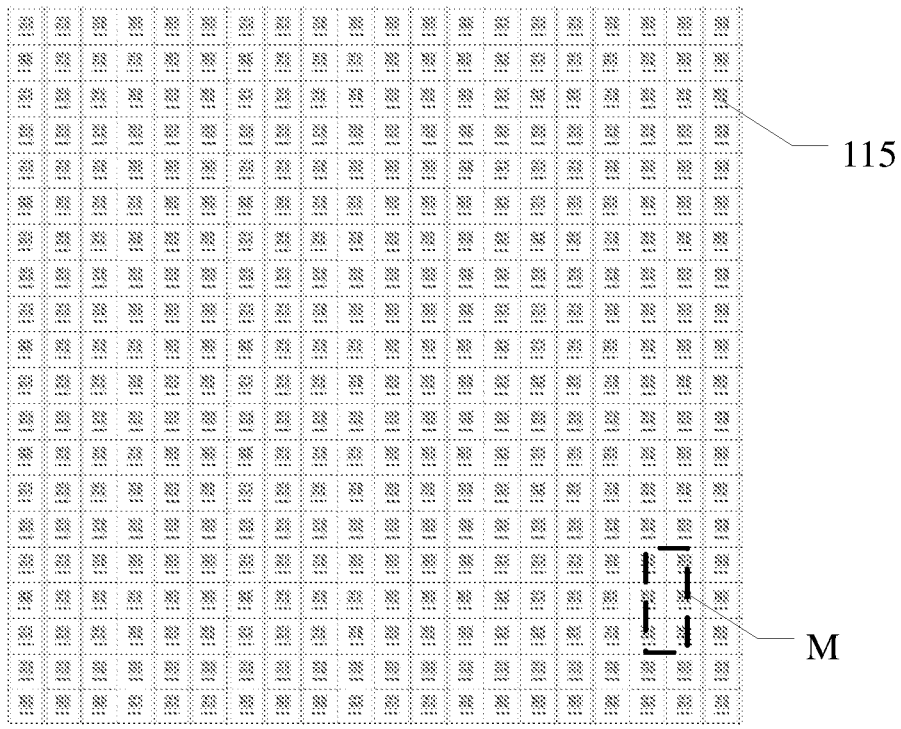
FIG. 5a is a schematic plan view of another touch display panel provided by an embodiment of the present disclosure.
Figure 5B:
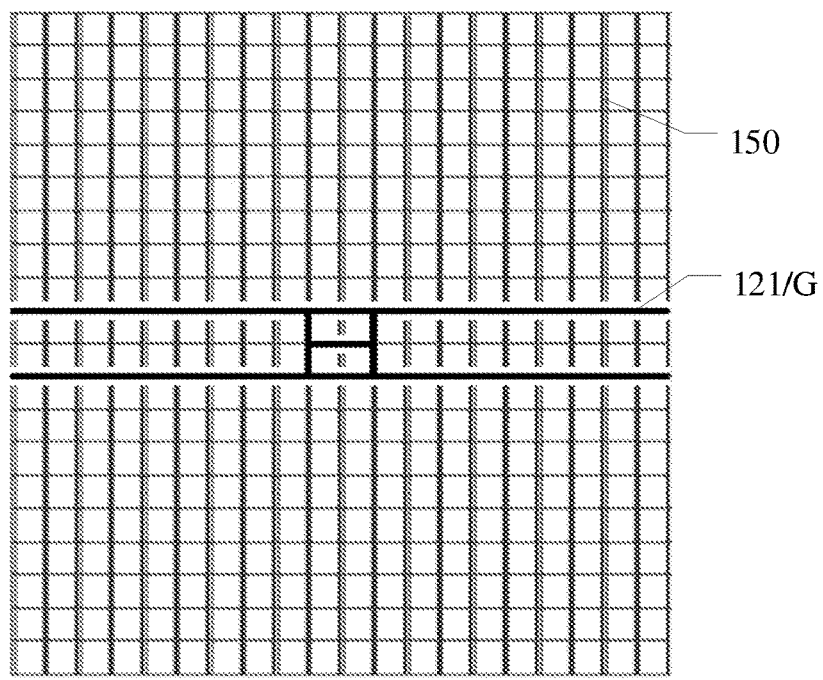
Figure 5C:
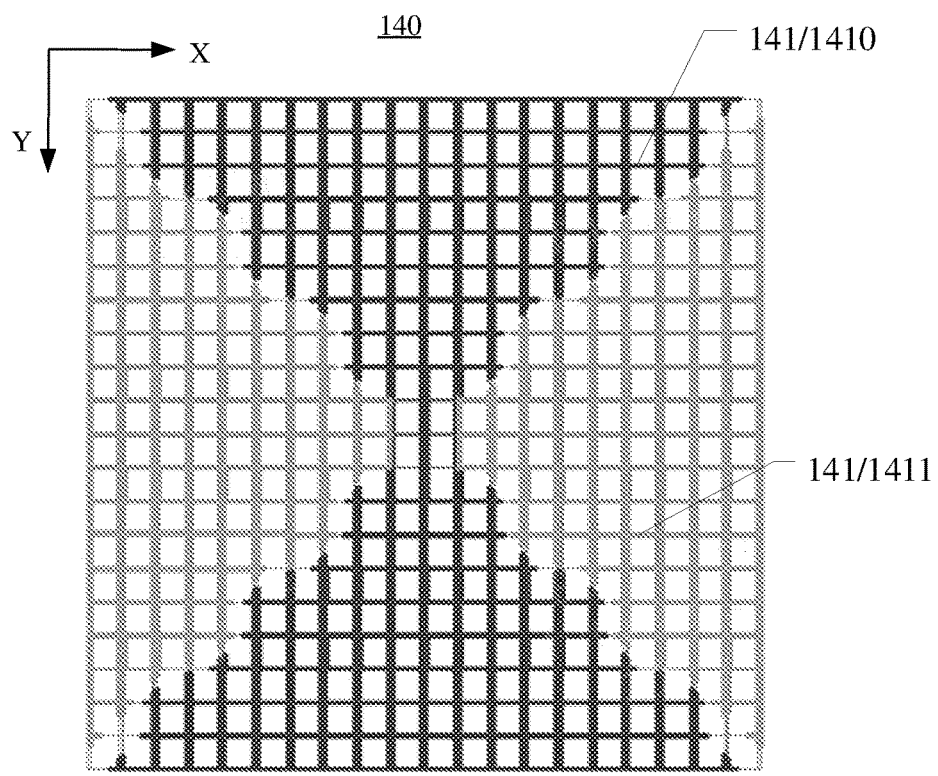

FIG. 5a is a schematic plan view of another touch display panel provided by an embodiment of the present disclosure; FIG. 5b is a schematic wiring view of a first conductive layer of the touch display panel in FIG. 5a; FIG. 5c is a schematic wiring view of a second conductive layer of the touch display panel in FIG. 5a. As illustrated by FIG. 5b, the first conductive layer 120 of the touch display panel 100 includes the touch conductive structure 121 and the shielding conductive pattern 150, which are insulated from each other. As illustrated by FIG. 5c, the second conductive layer 140 of the touch display panel 100 includes the plurality of touch electrodes 141. As illustrated by FIGS. 5a to 5c, the orthographic projection of the shielding conductive pattern 150 on the base substrate overlaps with the orthographic projections of the signal lines (not illustrated by the figure) and the orthographic projections of the plurality of touch electrodes 141 on the base substrate respectively. Therefore, by arranging the shielding conductive pattern 150 on the first conductive layer 120, the shielding effect of the shielding conductive pattern 150 on the signal line 112 and the touch electrode 141 can be realized, the crosstalk between the signal line 112 and the touch electrode 141 can be reduced, the touch signal-to-noise ratio can be improved, and the display effect can be improved. There is no need to additionally add a separate shielding conductive pattern 150 and a mask process for forming the shielding conductive pattern 150, so that the manufacturing cost and manufacturing cycle can be saved, the thickness of the touch display panel 100 is not increased, and the flexibility and variability of the touch display panel 100 can be improved. Meanwhile, the shielding conductive pattern 150 insulated from the touch conductive structure 121 is arranged on the first conductive layer 120, which can further improve the metal visibility problems, water ripples and metal diffraction stripes between the first conductive layer 120 and the second conductive layer 140, and further improve the display effect. It should be noted that, as in FIG. 5b, the shielding conductive pattern 150 and the touch conductive structure 121 are insulated adjacent to each other.

In some examples, as illustrated by FIGS. 5a to 5c, the orthographic projection of the touch conductive structure 121 of the first conductive layer 120 on the base substrate and the orthographic projection of at least one of the plurality of touch electrodes 141 on the base substrate have a second overlapping region G. Outside the second overlapping region G, the orthographic projection of the shielding conductive pattern 150 on the base substrate overlaps with the orthographic projection of the signal line 112 and the orthographic projection of the touch electrode 141 on the base substrate 111 respectively. Therefore, the shielding conductive pattern 150 can better shield the touch electrode 141 outside the second overlapping region G, thereby improving the touch performance and display performance of the touch display panel 100.

In some examples, as illustrated by FIGS. 5a to 5c, the orthographic projection of the shielding conductive pattern 150 on the base substrate completely overlaps with the orthographic projection of the touch electrode 141 on the base substrate outside the second overlapping region G. Therefore, the shielding conductive pattern 150 can shield all the touch electrodes 141 in the touch display panel 100 except the second overlapping region G, so that the shielding of the shielding conductive pattern 150 on the touch electrodes 141 can be better realized.

Figure 5D:
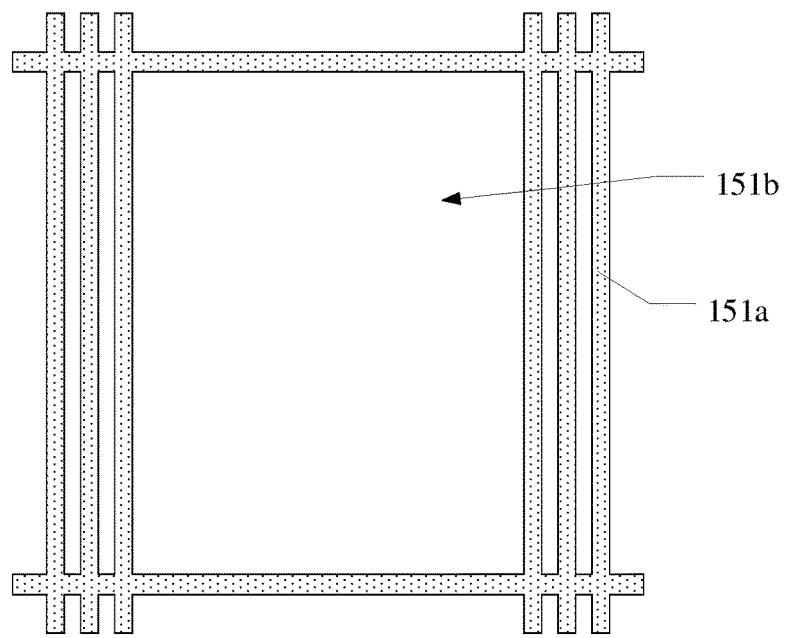
FIG. 5d is a partially enlarged schematic view of a shielding conductive pattern of the first conductive layer in FIG. 5b.
Figure 5E:
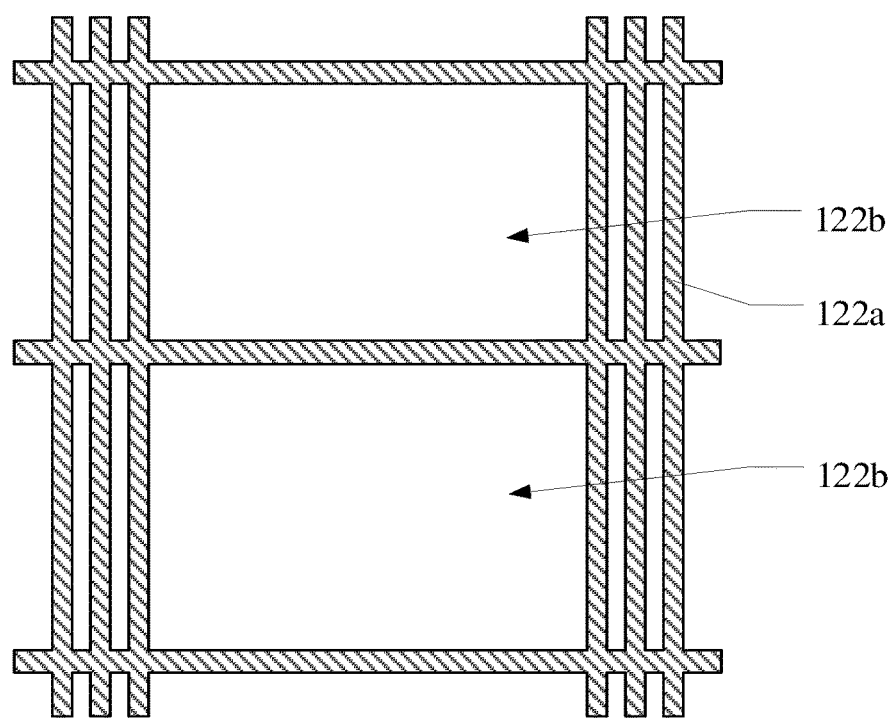
FIG. 5e is a partially enlarged schematic view of a touch conductive structure of the first conductive layer in FIG. 5b.
Figure 5F:
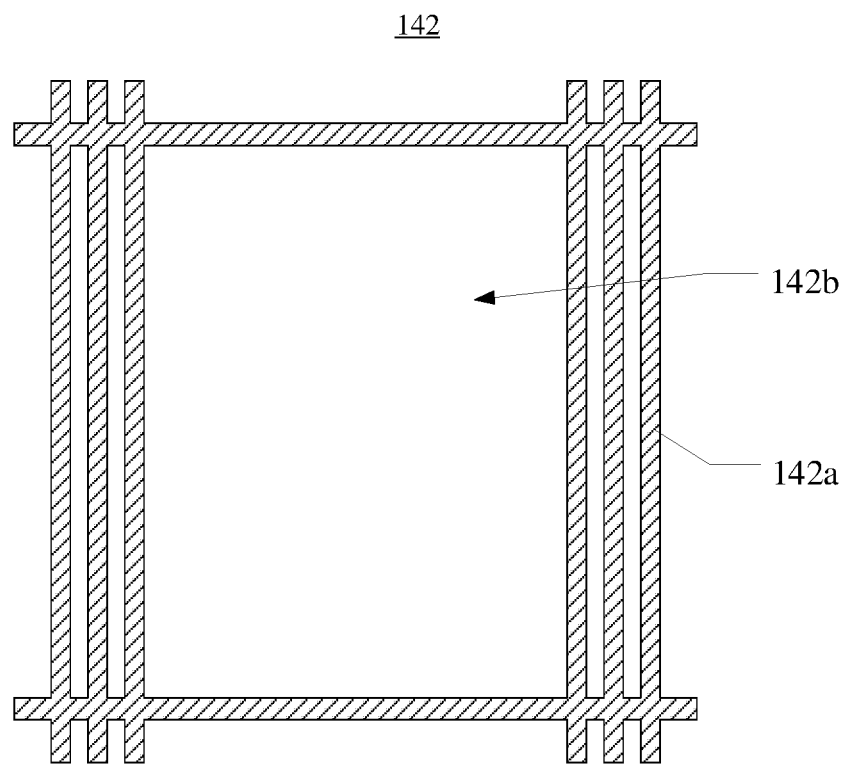
FIG. 5f is a partially enlarged schematic view of a touch electrode of the second conductive layer in FIG. 5c.

FIG. 5d is a partially enlarged schematic view of a shielding conductive pattern of the first conductive layer in FIG. 5b; FIG. 5e is a partially enlarged schematic view of a touch conductive structure of the first conductive layer in FIG. 5b; FIG. 5f is a partially enlarged schematic view of a touch electrode of the second conductive layer in FIG. 5c. As illustrated by FIG. 5d, the shielding conductive pattern 150 is a first metal mesh 151, and the first metal mesh 151 includes a first metal mesh line 151a and a plurality of first hollows 151b surrounded by the first metal mesh line 151a. As illustrated by FIG. 5e, the touch conductive structure 121 is a second metal mesh 122, and the second metal mesh 122 includes a second metal mesh line 122a and a plurality of second hollows 122a surrounded by second metal mesh lines 122a. As illustrated by FIG. 5f, each touch electrode 141 is a third metal mesh 142, and the third metal mesh 142 includes a third metal mesh line 142a and a plurality of third hollows 142b surrounded by the third metal mesh line 142a. By gridding the touch electrode 141, the touch conductive structure 121 and the shielding conductive pattern 150, pixel units can be arranged at the gridded hollow positions, thus ensuring the touch performance and display performance of the touch display panel 100 at the same time.

For example, as illustrated by FIGS. 5d to 5f, an orthographic projection of the first metal mesh 151 on the base substrate 111 can completely overlap with an orthographic projection of the third metal mesh 142 on the base substrate 111, and an orthographic projection of the second metal mesh 122 can completely overlap with an orthographic projection of the third metal mesh 142 on the base substrate 111.

For example, as illustrated by FIGS. 5b and 5d, the first metal mesh line 151a is disconnected at the second metal mesh line 122a, that is to say, the shielding conductive pattern 150 is disconnected at the touch conductive structure 121, so that the first metal mesh line 151a is insulated from the second metal mesh line 122a.

For example, as illustrated by FIGS. 5b and 5d, the first metal mesh line 151a is divided into an upper portion and a lower portion by the second metal mesh line 122a, that is to say, the shielding conductive pattern 150 is divided into the upper portion and the lower portion by the touch conductive structure 121, and the upper portion and the lower portion are separated by the second metal mesh line 122a, and the first metal mesh line 151a of the upper portion is interconnected, and the first metal portion line 151a of the lower portion is interconnected. Of course, the embodiment of the present disclosure does not limit thereto, and the first metal mesh line 151a may not be separated by the second metal mesh lines 122a according to different patterns of the second metal mesh line, so that the first metal mesh line 151a may also be connected.

For example, as illustrated by FIGS. 5b and 5e, the first conductive layer 120 may further include an etching residue pattern or a dummy pattern surrounded by the second metal mesh line 122a, which are disconnected at the second metal mesh line 122a and may not be connected with any signal. Of course, the embodiment of the present disclosure is not limited thereto, and there may be no etching residual pattern or dummy pattern according to different patterns of the second metal mesh line.

Figure 5G:
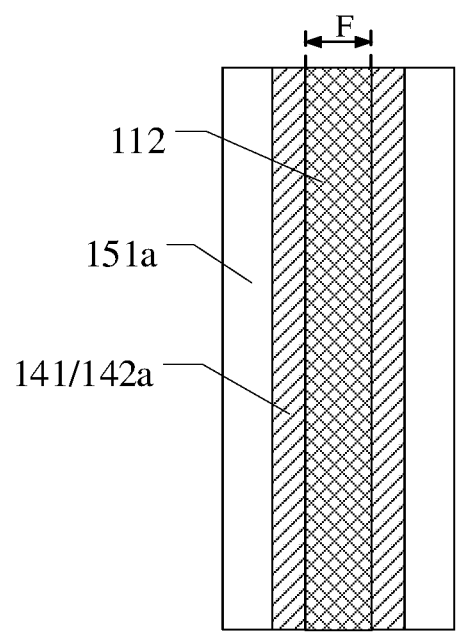

FIG. 5g is a partially enlarged schematic view of a dashed line region M in FIG. 5a. In some examples, as illustrated by FIGS. 5a and 5g, an orthographic projection of at least part of the first metal mesh line 151a on the base substrate overlaps with the orthographic projection of the signal line 112 and the orthographic projection of the third metal mesh line 142a of at least one of the plurality of touch electrodes 141 on the base substrate respectively. Therefore, the first metal mesh line 151a can shield the signal line 112 and the third metal mesh line 142a of the touch electrode 141.

For example, as illustrated by FIG. 5g, the orthographic projection of the signal line 112 on the base substrate and the orthographic projection of the third metal mesh line 142a of at least one of the plurality of touch electrodes 141 on the base substrate have an overlapping region F, and in the overlapping region F, the orthographic projection of at least part of the first metal mesh line 151a on the base substrate overlaps with the orthographic projection of the signal line 112 and the orthographic projection of the third metal mesh line 142a of at least one of the plurality of touch electrodes 141 on the base substrate respectively. Therefore, the first metal mesh line 151a can shield the signal line 112 and the touch electrode 141 corresponding to the third metal mesh line 142a in the overlapping region F of the signal line 112 and the third metal mesh line 142a, so as to better improve the shielding efficiency and further improve the touch performance and display performance of the touch display panel 100.

For example, as illustrated by FIG. 5g, outside the overlapping region F, the orthographic projection of at least part of the first metal mesh line 151a on the base substrate overlaps with the orthographic projection of the third metal mesh line 142a of at least one of the plurality of touch electrodes 141 on the base substrate. Therefore, the first metal mesh line 151a can better shield the touch electrode 141 corresponding to the third metal mesh line 142a outside the overlapping region F, thereby improving the touch performance and display performance of the touch display panel 100.

For example, as illustrated by FIG. 5g, the orthographic projection of at least part of the first metal mesh line 151a on the base substrate can cover the orthographic projection of the signal line 112 on the base substrate 111 and the orthographic projection of the third metal mesh line 142a of at least one of the plurality of touch electrodes 141 on the base substrate respectively in the width direction, so that the shielding effect of the first metal mesh line 151a on the signal line 112 and the third metal mesh line 142a of the touch electrode 141 can be better realized. It should be noted that the width direction is in a direction perpendicular to the extending direction of the first metal mesh line 151a.

For example, as illustrated by FIG. 5b to 5f, the orthographic projection of the second metal mesh 122 of the touch conductive structure 121 and the orthographic projection of the third metal mesh 142 of the touch electrode 141 on the base substrate have a second overlapping region G, and, outside the second overlapping region G, the orthographic projection of the first metal mesh line 151a completely overlaps with the third metal mesh line 142a on the base substrate, Therefore, the first metal mesh 151 can better shield the touch electrode 141, so as to better avoid the mutual interference between the touch electrode 141 and the signal line 112.

Figure 5H:
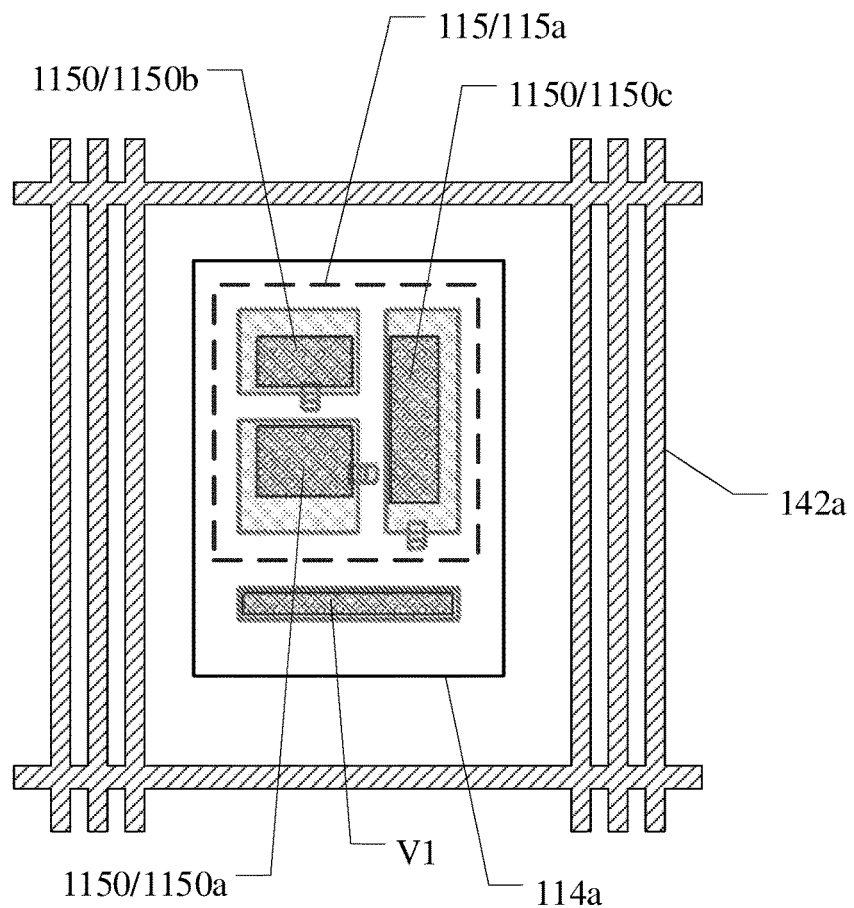

FIG. 5h is a partially enlarged schematic view of a pixel group of FIG. 5a. As illustrated by FIGS. 5a and 5h, the display substrate of the touch display panel 100 further includes a plurality of pixel units 1150, which are divided into a plurality of pixel groups 115, and each pixel group 115 includes a plurality of pixel units 1150, and the first metal mesh line 151a (not illustrated by the Figure), the second metal mesh line 122a (not illustrated by the Figure) and the third metal mesh line 142a are disposed outside effective display regions of the plurality of pixel units 1150. The first metal mesh line 151a and the second metal mesh line 122a, which are not illustrated by the Figure, are both arranged outside the effective display regions, and the orthographic projection of the first metal mesh line 151a and the orthographic projection of the second metal mesh line 122a on the base substrate 111 both overlap with the orthographic projection of the third metal mesh line 142a on the base substrate 111. Therefore, the first metal mesh line 151a, the second metal mesh line 122a and the third metal mesh line 142a will not affect the display brightness and display effect of the display panel. It should be noted that the effective display region of the pixel unit 1150 is a region where the pixel unit emits light. The embodiment of the present disclosure does not limit the number and arrangement of the pixel units 1150 of the pixel group 115.

For example, as illustrated by FIG. 5h, the plurality of pixel units 1150 can be divided into a plurality of first pixel groups 115a, and each first pixel group 115a can include one first pixel unit 1150a, one second pixel unit 1150b and one third pixel unit 1150c.

For example, as illustrated by FIGS. 5d to 5h, one first pixel group 115a may be arranged within the first hollow 151b. For example, one first pixel group 115a can be arranged within the second hollow 122b. For example, two first pixel groups 115a may be arranged within the second hollow 122b. For example, one first pixel group 115a may be arranged within the third hollow 142b. For example, one first pixel group 115a is arranged within the first hollow 151b, the second hollow 122b and the third hollow 142b, respectively. The embodiment of the present disclosure does not limit the number of the first pixel group 115a that can be arranged in the first hollow 151b, the second hollow 122b and the third hollow 142b.

For example, the plurality of pixel units 1150 can also be divided into a plurality of second pixel groups 115b, and each of the plurality of second pixel groups 115b can include one first pixel unit 1150a, two second pixel units 1150b and one third pixel unit 1150c.

For example, as illustrated by FIGS. 5d to 5f, one second pixel group 115b may be arranged within the first hollow 151b. For example, one second pixel group 115b can be arranged within the second hollow 122b. For example, two second pixel groups 115b may be arranged within the second hollow 122b. For example, one second pixel group 115b can be arranged within the third hollow 142b. For example, one second pixel group 115b is arranged within the first hollow 151b, the second hollow 122b and the third hollow 142b, respectively. The embodiment of the present disclosure does not limit the number of the second pixel groups 115b that can be arranged in the first hollow 151b, the second hollow 122b and the third hollow 142b.

For example, the first pixel unit 1150a is configured to emit green light, the second pixel unit 1150b is configured to emit red light, and the third pixel unit 1150c is configured to emit blue light.

For example, as illustrated by FIGS. 5d to 5f, one pixel unit 1150 may be arranged in the first hollow 151b. For example, one pixel unit 1150 may be arranged in the second hollow 122b. For example, one pixel unit 1150 may be arranged in the third hollow 142b. The embodiment of the present disclosure does not limit the number of pixel units 1150 that can be arranged in the first hollow 151b, the second hollow 122b and the third hollow 142b. For example, the pixel unit 1150 may be configured to emit green light or red light or blue light. In some examples, as illustrated by FIGS. 5d to 5f, the orthographic projection of the first hollow 151b on the base substrate may be rectangular. For example, the orthographic projection of the second hollow 122b on the base substrate may be rectangular. For example, the orthographic projection of the third hollow 142b on the base substrate may be rectangular. The embodiment of the present disclosure does not limit shapes of orthographic projection of the first hollow 151b, the second hollow 122b and the third hollow 142b on the base substrate, and for example, they can also be polygons.

In some examples, as illustrated by FIG. 5h, the second electrode 114a of the touch display panel 100 may be a cathode, and the cathode may be connected to a common power line (not illustrated by the Figure) through a connection via hole V1. In this example, the orthographic projection of the third metal mesh line 142a on the base substrate 111 does not overlap with the orthographic projection of the second electrode 114a on the base substrate 111. Of course, the embodiment of the present disclosure does not limit thereto, and the orthographic projections of the regions of the first metal mesh line 151a (not illustrated by the Figure), the second metal mesh line 122a (not illustrated by the Figure) and the third metal mesh line 142a outside the effective display regions of the pixel units 1150 on the base substrate 111 may also overlap with the orthographic projection of the second electrode 114a on the base substrate 111.

Figure 5J:
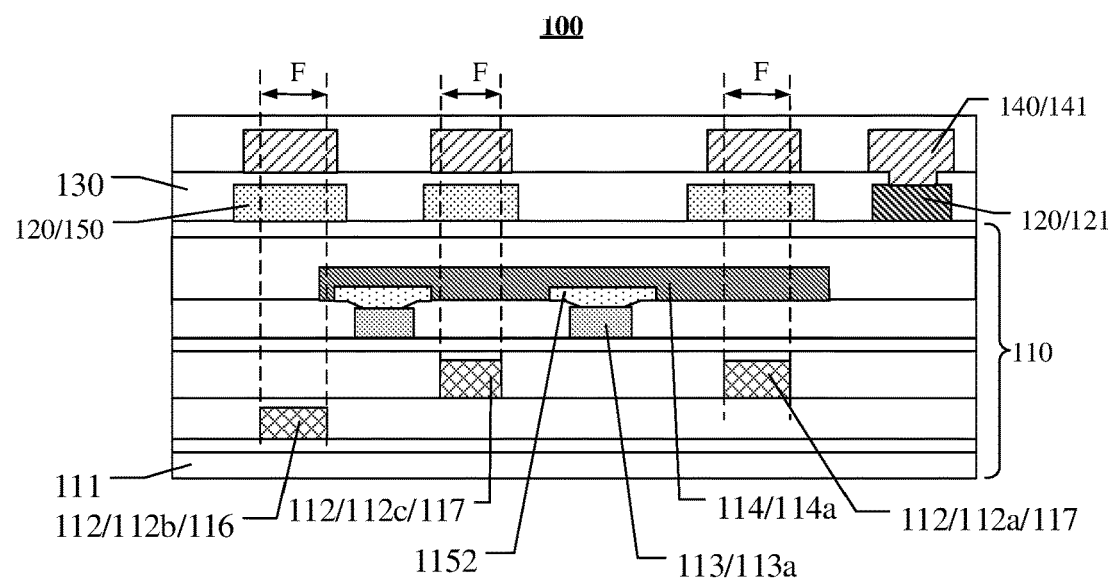
FIGS. 5j and 5k are schematic sectional views of another touch display panel provided by an embodiment of the present disclosure.
Figure 5K:
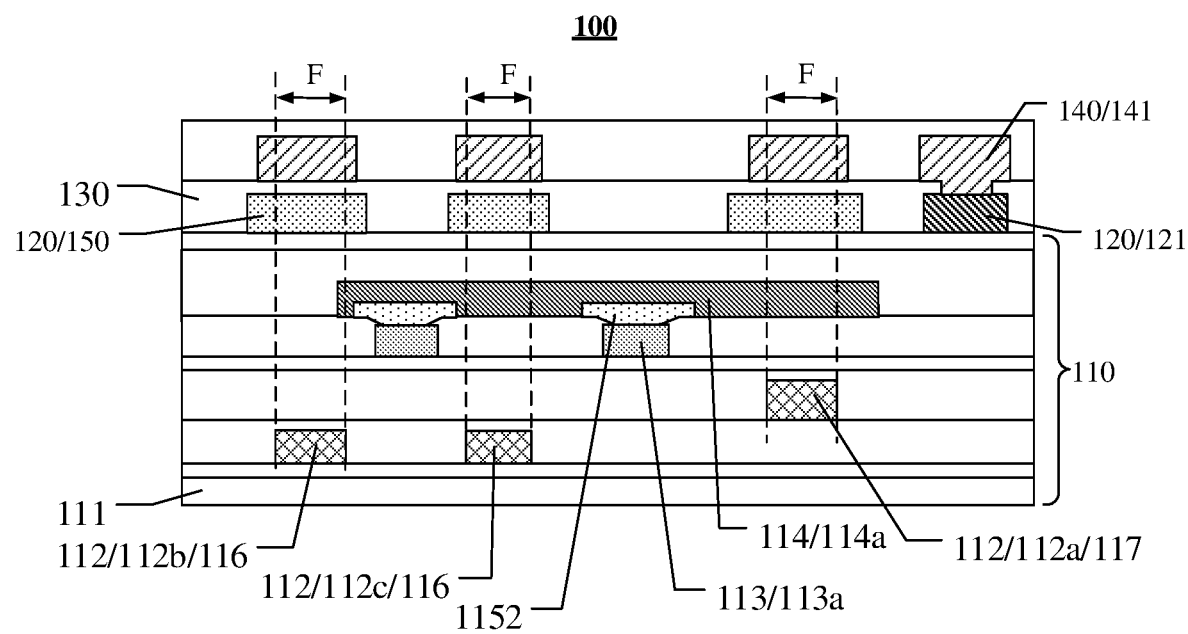

FIGS. 5j and 5k are schematic sectional views of another touch display panel provided by an embodiment of the present disclosure. As illustrated by FIGS. 5j and 5k, the orthographic projection of the touch electrode 141 and the shielding conductive pattern 150 on the base substrate 111 overlap with the orthographic projection of the second electrode 114a (e.g., cathode) of the second electrode layer 114 on the base substrate 111. Therefore, the shielding conductive pattern 150 can better shield the touch electrode 141 and the signal line 112 outside the effective display regions of the pixel units where is not affected by the shielding conductive pattern 150.

For example, as illustrated by FIG. 5j, the reset line 112c and the data line 112a may be located in the conductive layer 117. For example, as illustrated by FIG. 5k, the reset line 112c and the gate line 112b may be located in the gate layer 116. The embodiment of the present disclosure does not restrict that different signal lines 112 are located in the gate layer 116 or the conductive layer 117.

Figure 6A:
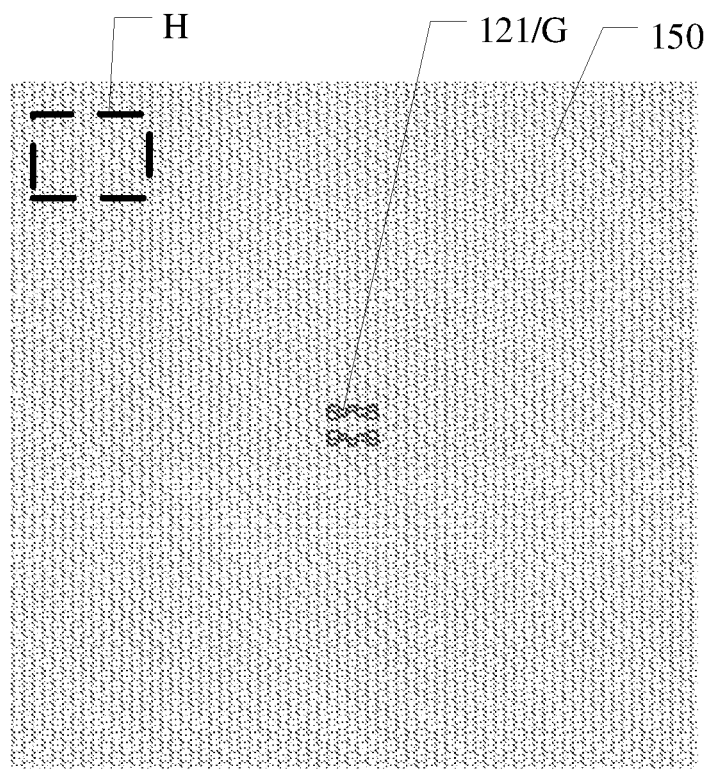
FIG. 6a is a schematic wiring view of a first conductive layer of another touch display panel according to an embodiment of the present disclosure.
Figure 6B:
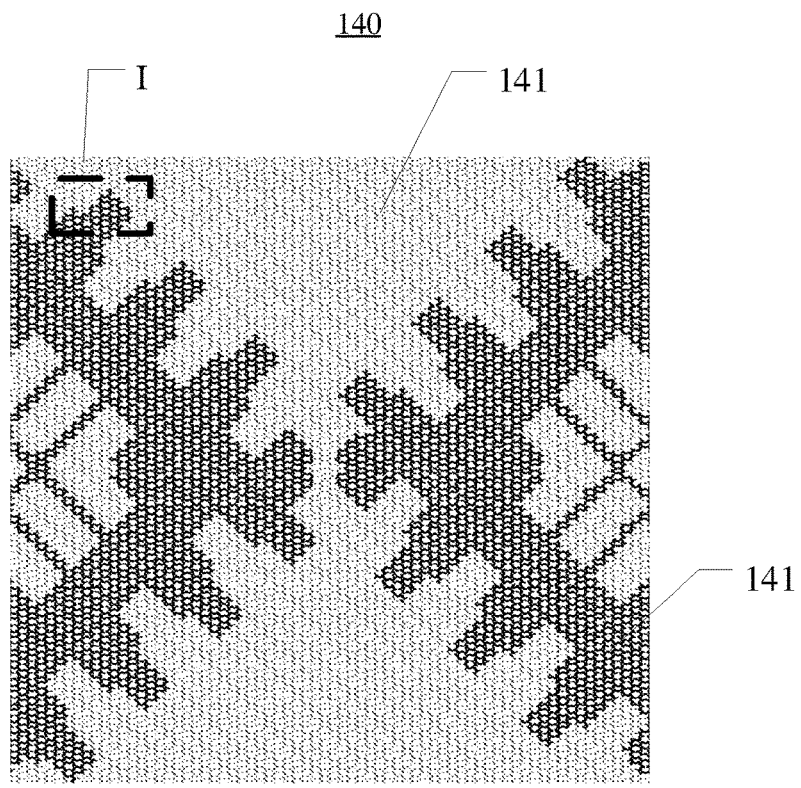

FIG. 6a is a schematic wiring view of a first conductive layer of another touch display panel according to an embodiment of the present disclosure; FIG. 6b is a schematic wiring view of a second conductive layer of the touch display panel corresponding to FIG. 6a. As illustrated by FIG. 6a, the first conductive layer 120 of the touch display panel 100 includes the touch conductive structure 121 and the shielding conductive pattern 150 which are insulated from each other. As illustrated by FIG. 6b, the second conductive layer 140 of the touch display panel 100 includes the plurality of touch electrodes 141. As illustrated by FIGS. 6a and 6b, the orthographic projection of the shielding conductive pattern 150 on the base substrate overlaps with the orthographic projection of the signal line (not illustrated by the Figure) and the orthographic projection of the plurality of touch electrodes 141 on the base substrate, respectively. Therefore, by arranging the shielding conductive pattern 150 on the first conductive layer 120, the shielding effect of the shielding conductive pattern 150 on the signal line (not illustrated by the Figure) and the touch electrode 141 can be realized, the crosstalk between the signal line (not illustrated by the Figure) and the touch electrode 141 can be reduced, the touch signal-to-noise ratio can be improved, and the display effect can be improved. There is no need to additionally add a separate shielding conductive pattern 150 and a mask process for forming the shielding conductive pattern 150, so that the manufacturing cost and manufacturing cycle can be saved, the thickness of the touch display panel 100 will not be increased, and the flexibility of the touch display panel 100 can be improved. Meanwhile, the shielding conductive pattern 150 insulated from the touch conductive structure 121 is arranged on the first conductive layer 120, which can further improve the metal visibility problems, water ripples and metal diffraction stripes between the first conductive layer 120 and the second conductive layer 140, and further improve the display effect. It should be noted that, as illustrated by FIG. 6a, the shielding conductive pattern 150 and the touch conductive structure 121 are insulated adjacent to each other.

In some examples, as illustrated by FIGS. 6a and 6b, there is a second overlapping region G between the orthographic projection of the touch conductive structure 121 of the first conductive layer 120 on the base substrate and the orthographic projection of at least one of the plurality of touch electrodes 141 on the base substrate. Outside the second overlapping region G, the orthographic projection of the shielding conductive pattern 150 on the base substrate overlaps with the orthographic projection of the touch electrode 141 on the base substrate. Therefore, the shielding conductive pattern 150 can better shield the touch electrode 141 outside the second overlapping region G, thereby improving the touch performance and display performance of the touch display panel 100.

In some examples, as illustrated by FIGS. 6a and 6b, the orthographic projection of the shielding conductive pattern 150 on the base substrate completely overlaps with the orthographic projection of the touch electrode 141 on the base substrate outside the second overlapping region G. Therefore, the shielding conductive pattern 150 can shield all the touch electrodes 141 in the touch display panel 100 except the second overlapping region G, so that the shielding of the shielding conductive pattern 150 on the touch electrodes 141 can be better realized.

Figure 6C:
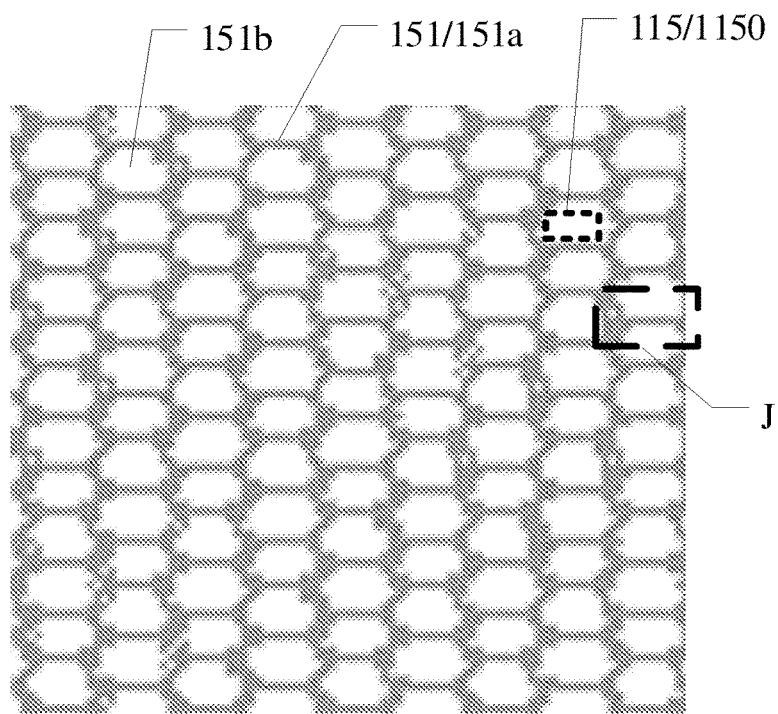
Figure 6D:
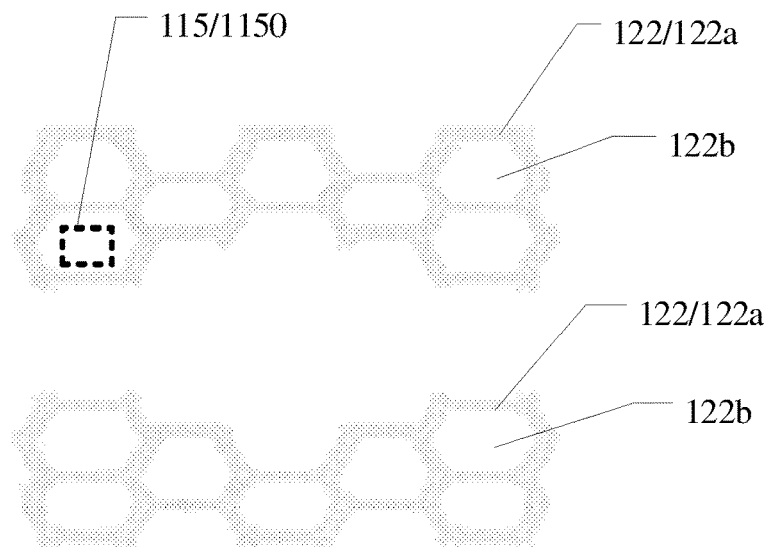
Figure 6E:
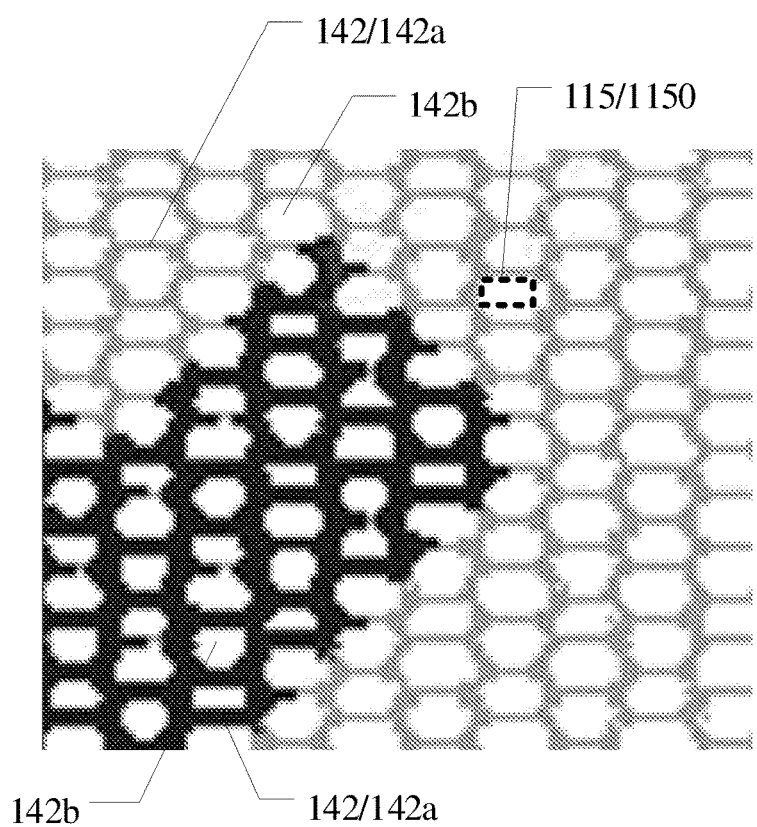
FIG. 6e is a partially enlarged schematic view of a dashed line region I in FIG. 6c.

FIG. 6c is a partially enlarged schematic view of a dashed line region H in FIG. 6a; FIG. 6d is an enlarged schematic view of a touch conductive structure of the first conductive layer in FIG. 6a; FIG. 6e is a partially enlarged schematic view of a dashed line region I in FIG. 6c. As illustrated by FIG. 6c, the shielding conductive pattern 150 is a first metal mesh 151, and the first metal mesh 151 includes a first metal mesh line 151a and a plurality of first hollows 151b surrounded by the first metal mesh line 151a. As illustrated by FIG. 6d, the touch conductive structure 121 is a second metal mesh 122, and the second metal mesh 122 includes a second metal mesh line 122a and a plurality of second hollows 122a surrounded by the second metal mesh lines 122a. As illustrated by FIG. 6e, each touch electrode 141 is a third metal mesh 142, and the third metal mesh 142 includes a third metal mesh line 142a and a plurality of third hollows 142b surrounded by the third metal mesh line 142a. By gridding the touch electrode 141, the touch conductive structure 121 and the shielding conductive pattern 150, pixel units can be arranged at the gridded hollow positions, thus ensuring the touch performance and display performance of the touch display panel 100 at the same time.

For example, as illustrated by FIGS. 6a and 6c, the first metal mesh lines 151a are connected with each other.

Figure 6F:
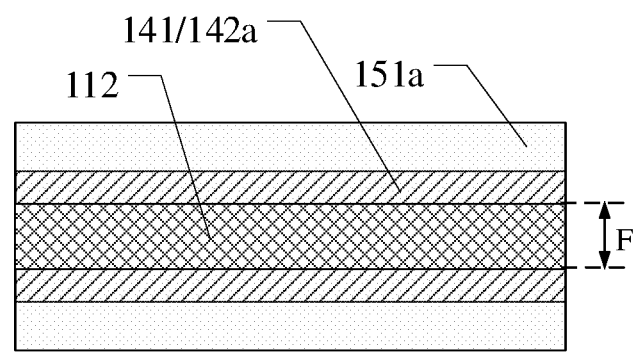
FIG. 6f is a partially enlarged schematic view of a dashed line region J in the touch display panel corresponding to FIG. 6c.

FIG. 6f is a partially enlarged schematic view of a dashed line region J in the touch display panel corresponding to FIG. 6c. In some examples, as illustrated by FIG. 6f, the orthographic projection of at least part of the first metal mesh line 151a on the base substrate overlaps with the orthographic projection of the signal line 112 and the orthographic projection of the third metal mesh line 142a of at least one of the plurality of touch electrodes 141 on the base substrate, respectively. Therefore, the first metal mesh line 151a can shield the signal line 112 and the third metal mesh line 142a of the touch electrode 141.

For example, as illustrated by FIG. 6f, the orthographic projection of the signal line 112 on the base substrate and the orthographic projection of the third metal mesh line 142a of at least one of the plurality of touch electrodes 141 on the base substrate have an overlapping region F. In the overlapping region F, the orthographic projection of at least part of the first metal mesh line 151a on the base substrate overlaps with the orthographic projection of the signal line 112 and the orthographic projection of the third metal mesh line 142a of at least one of the plurality of touch electrodes 141 on the base substrate, respectively. Therefore, the first metal mesh line 151a can shield the signal line 112 and the touch electrode 141 corresponding to the third metal mesh line 142a in the overlapping region F of the signal line 112 and the third metal mesh line 142a, so as to better improve the shielding efficiency and further improve the touch performance and display performance of the touch display panel 100.

For example, as illustrated by FIG. 6f, the orthographic projection of at least part of the first metal mesh line 151a on the base substrate outside the overlapping region F overlaps with the orthographic projection of the third metal mesh line 142a of at least one of the plurality of touch electrodes 141 on the base substrate. Therefore, the first metal mesh line 151a can better shield the touch electrode 141 corresponding to the third metal mesh line 142a outside the overlapping region F, thereby improving the touch performance and display performance of the touch display panel 100.

For example, as illustrated by FIG. 6f, the orthographic projection of at least part of the first metal mesh line 151a on the base substrate can cover the orthographic projection of the signal line 112 on the base substrate 111 and the orthographic projection of the third metal mesh line 142a of at least one of the plurality of touch electrodes 141 on the base substrate respectively in the width direction, so that the shielding effect of the first metal mesh line 151a on the signal line 112 and the third metal mesh line 142a of the touch electrode 141 can be better realized. It should be noted that the width direction is in a direction perpendicular to the extending direction of the first metal mesh line 151a.

For example, as illustrated by FIG. 6a to 6e, the orthographic projection of the second metal mesh 122 of the touch conductive structure 121 on the base substrate 111 and the orthographic projection of the third metal mesh 142 of the touch electrode 141 on the base substrate have a second overlapping region G, and, outside the second overlapping region G, the orthographic projection of the first metal mesh line 151a completely overlap with the third metal mesh line 142a on the base substrate. Therefore, the first metal mesh 151 can better shield the touch electrode 141, so as to better avoid the mutual interference between the touch electrode 141 and the signal line 112.

For example, as illustrated by FIGS. 6a to 6e, the display substrate of the touch display panel 100 further includes a plurality of pixel units 1150, which are divided into a plurality of pixel groups 115, and each of the pixel groups 115 includes a plurality of pixel units 1150, and the first metal mesh line 151a, the second metal mesh line 122a and the third metal mesh line 142a are disposed outside the effective display regions of the plurality of pixel units 1150. Therefore, the first metal mesh line 151a, the second metal mesh line 122a and the third metal mesh line 142a will not affect the display brightness and display effect of the display panel. It should be noted that the effective display region of the pixel unit 1150 is a region where the pixel unit emits light. The embodiment of the present disclosure does not limit the number and arrangement of the pixel units 1150 of the pixel group 115.

Figure 6G:
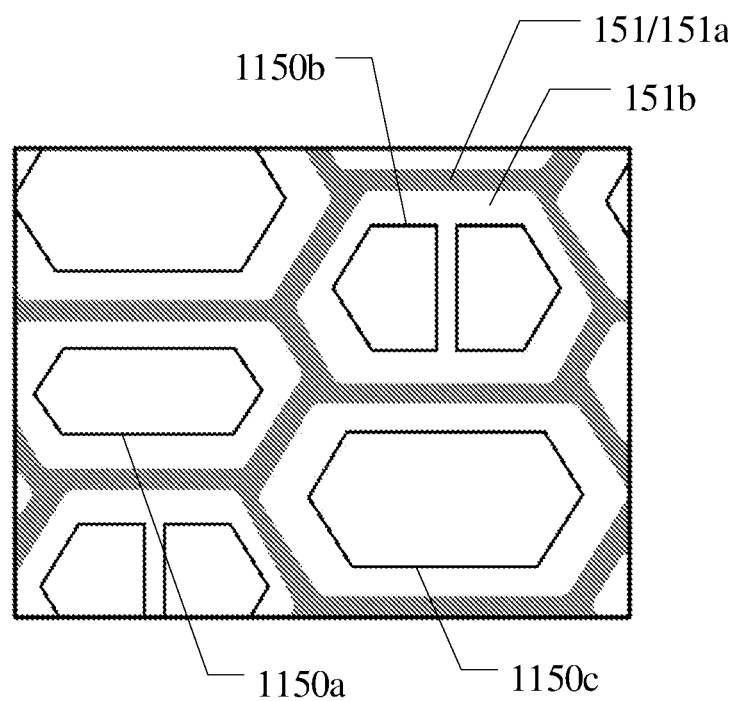

FIG. 6g is a schematic view of a pixel unit arrangement of the touch display panel corresponding to FIG. 6a. As illustrated by FIG. 6g, one first pixel unit 1150a can be arranged in one first hollow 151b, and two second pixel units 1150b and one third pixel unit 1150c can be arranged separately in two first hollows 151b adjacent to the first hollows 151b, so that one first pixel unit 1150a, two second pixel units 1150b and one third pixel unit 1150c form the second pixel group 115b. Similarly, the arrangement of the pixel units in the second hollow 122b and the third hollow 142b may be the same as the arrangement of the pixel units in the first hollow 151b, which is not repeated here. Of course, the embodiment of this disclosure does not limit the number of pixel units that can be set in the first hollow 151b, the second hollow 122b, and the third hollow 142b and the arrangement of the pixel units.

For example, the first pixel unit 1150a is configured to emit red light, the second pixel unit 1150b is configured to emit green light, and the third pixel unit 1150c is configured to emit blue light. Of course, the embodiment of the present disclosure does not limit the light emitting color of the pixel unit.

Figure 6H:
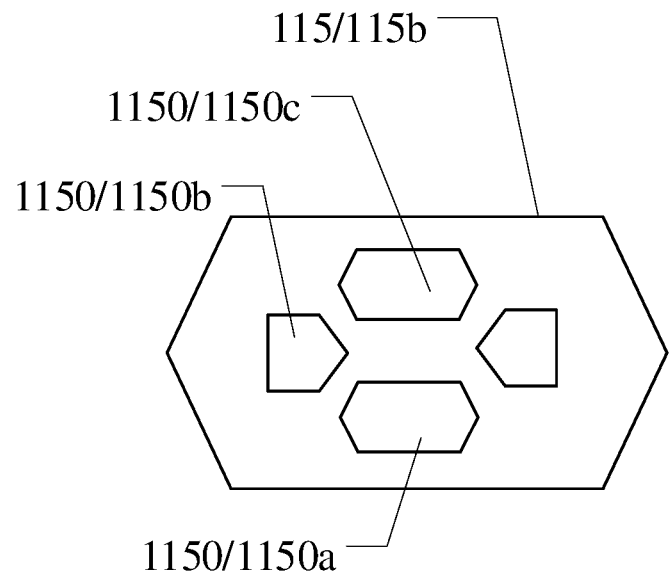
FIG. 6h is a schematic structural view of a pixel group provided by an embodiment of the present disclosure.

FIG. 6h is a schematic structural view of a pixel group provided by an embodiment of the present disclosure. As illustrated by FIG. 6h, the plurality of pixel units 1150 can also be divided into a plurality of second pixel groups 115b. Each of the plurality of second pixel groups 115b can include one first pixel unit 1150a, two second pixel units 1150b and one third pixel unit 1150c. As illustrated by FIGS. 6a to 6e, one second pixel group 115b can be arranged within the first hollow 151b. For example, one second pixel group 115b can be arranged within the second hollow 122b. For example, two second pixel groups 115b may be arranged within the second hollow 122b. For example, one second pixel group 115b can be arranged within the third hollow 142b. For example, one second pixel group 115b is arranged within the first hollow 151b, the second hollow 122b and the third hollow 142b, respectively. The embodiment of the present disclosure does not limit the number of the second pixel groups 115b that can be arranged in the first hollow 151b, the second hollow 122b and the third hollow 142b.

For example, the plurality of pixel units 1150 can also be divided into a plurality of first pixel groups 115a, and each of the plurality of first pixel groups 115a can include one first pixel unit 1150a, one second pixel unit 1150b and one third pixel unit 1150c.

For example, as illustrated by FIGS. 6a to 6e, one first pixel group 115a may be arranged within the first hollow 151b. For example, one first pixel group 115a can be arranged within the second hollow 122b. For example, two first pixel groups 115a may be arranged within the second hollow 122b. For example, one first pixel group 115a may be arranged within the third hollow 142b. For example, one first pixel group 115a is arranged within the first hollow 151b, the second hollow 122b and the third hollow 142b, respectively. The embodiment of the present disclosure does not limit the number of the first pixel group 115a that can be arranged within the first hollow 151b, the second hollow 122b and the third hollow 142b.

For example, the first pixel unit 1150a is configured to emit red light, the second pixel unit 1150b is configured to emit green light, and the third pixel unit 1150c is configured to emit blue light.

For example, as illustrated by FIGS. 6a to 6e, one pixel unit 1150 may be arranged in the first hollow 151b. For example, one pixel unit 1150 may be arranged in the second hollow 122b. For example, one pixel unit 1150 may be arranged in the third hollow 142b. The embodiment of the present disclosure does not limit the number of pixel units 1150 that can be arranged in the first hollow 151b, the second hollow 122b and the third hollow 142b. For example, the pixel unit 1150 may be configured to emit green light or red light or blue light. In some examples, as illustrated by FIGS. 6c to 6e, the orthographic projection of the first hollow 151b on the base substrate may be hexagon. For example, the orthographic projection of the second hollow 122b on the base substrate may be hexagon. For example, the orthographic projection of the third hollow 142b on the base substrate may be hexagon. The embodiment of the present disclosure does not limit shapes of orthographic projection of the first hollow 151b, the second hollow 122b and the third hollow 142b on the base substrate, and for example, they can also be polygons.

Figure 7:
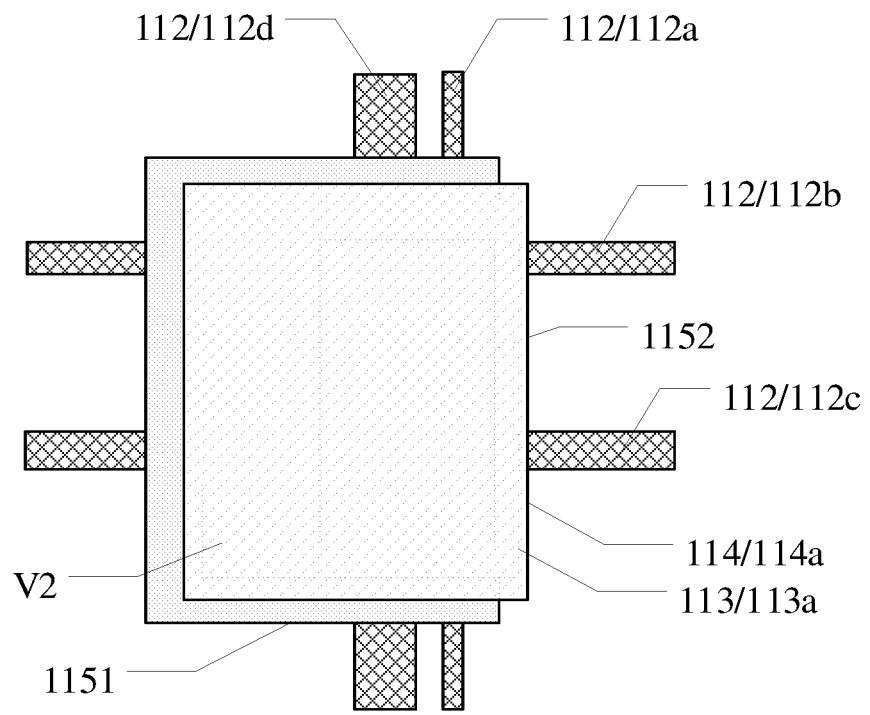
FIG. 7 is a partial structural view of another touch display panel provided by an embodiment of the present disclosure.

FIG. 7 is a partial structural view of another touch display panel provided by an embodiment of the present disclosure. As illustrated by FIG. 7, each pixel unit 1150 of the touch display panel 100 further includes a pixel driving circuit 1151 and a light emitting layer 1152. The pixel driving circuit 1151 is located on a side of the signal line 112 away from the base substrate; the light emitting layer 1152 is located between the first electrode layer 113 and the second electrode layer 114. The first electrode 113a is an anode, and the second electrode 114a is a cathode. The signal line 112 is configured to provide a driving signal to the pixel driving circuit 1151. For example, the signal line 112 includes at least one selected from the group consisting of a gate line 112b, a data line 112a, a power line 12d, an initialization line, a reset line 12c, and a light emission control line provided for the pixel driving circuit 1151. The pixel driving circuit 1151 is electrically connected to the anode, for example, through a connection via hole V2, and is configured to drive the light emitting layer 1152 to emit light.

Figure 8:
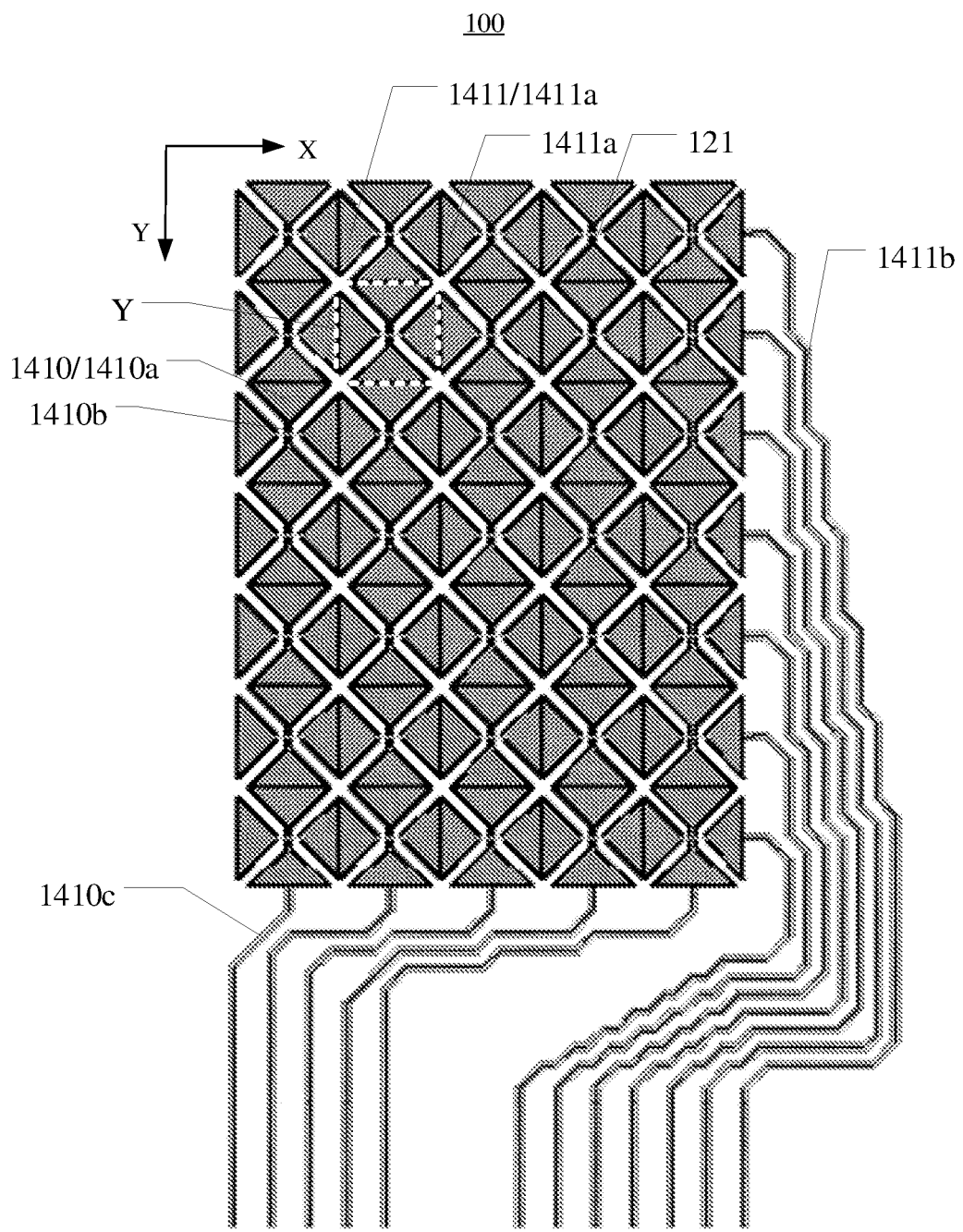
FIG. 8 is a schematic plan view of a touch electrode of another touch display panel according to an embodiment of the present disclosure.

FIG. 8 is a schematic plan view of a touch electrode of another touch display panel according to an embodiment of the present disclosure. As illustrated by FIG. 8, the plurality of touch electrodes 141 of the touch display panel 100 includes a plurality of first touch electrodes 1410 and a plurality of second touch electrodes 1411. The plurality of first touch electrodes 1410 are arranged along a first direction X, and each first touch electrode 1410 extends along a second direction Y intersecting with the first direction X. The plurality of second touch electrodes 1411 are arranged along the second direction Y, and each second touch electrode 1411 includes a plurality of touch electrode blocks 1411a arranged along the first direction X. Two adjacent touch electrode blocks 1411a in the first direction X are electrically connected by the touch conductive structure 121.

In some examples, as illustrated by FIG. 8, the first touch electrode 1410 includes a plurality of touch electrode portions 1410a and connection portions 1410b between two adjacent touch electrode portions 1410a.

In some examples, as illustrated by FIG. 8, each touch electrode block 1411a and each touch electrode portion 1410a are diamond-shaped metal meshes. The embodiment of the present disclosure does not limit the shapes of each touch electrode block 1411a and each touch electrode portion 1410a.

For example, as illustrated by FIG. 8, the diamond-shaped metal mesh can be a diamond-shaped metal mesh as illustrated by FIG. 5c, that is to say, the first touch electrode 1410 and the second touch electrode 1411 in the dashed line region Y illustrated by FIG. 8 correspond to the first touch electrode 1410 and the second touch electrode 1411 in the diamond-shaped metal mesh as illustrated by FIG. 5c, or the first touch electrode 1410 and the second touch electrode 1411 in the diamond-shaped metal mesh as illustrated by FIG. 5c are arrayed along the first direction X and the second direction Y to get the first touch electrode 1410 and the second touch electrode 1411 illustrated by FIG. 8.

For example, the touch display panel 100 further includes a plurality of first touch electrode leads 1410c and a plurality of second touch electrode leads 1411b, the first touch electrode leads 1410c are electrically connected with the first touch electrodes 1410, and the second touch electrode leads 1411b are electrically connected with the second touch electrodes 1411. Therefore, signals can be provided to the touch electrodes of the touch display panel through the first touch electrode leads 1410c and the second touch electrode leads 1411b.

Figure 9A:
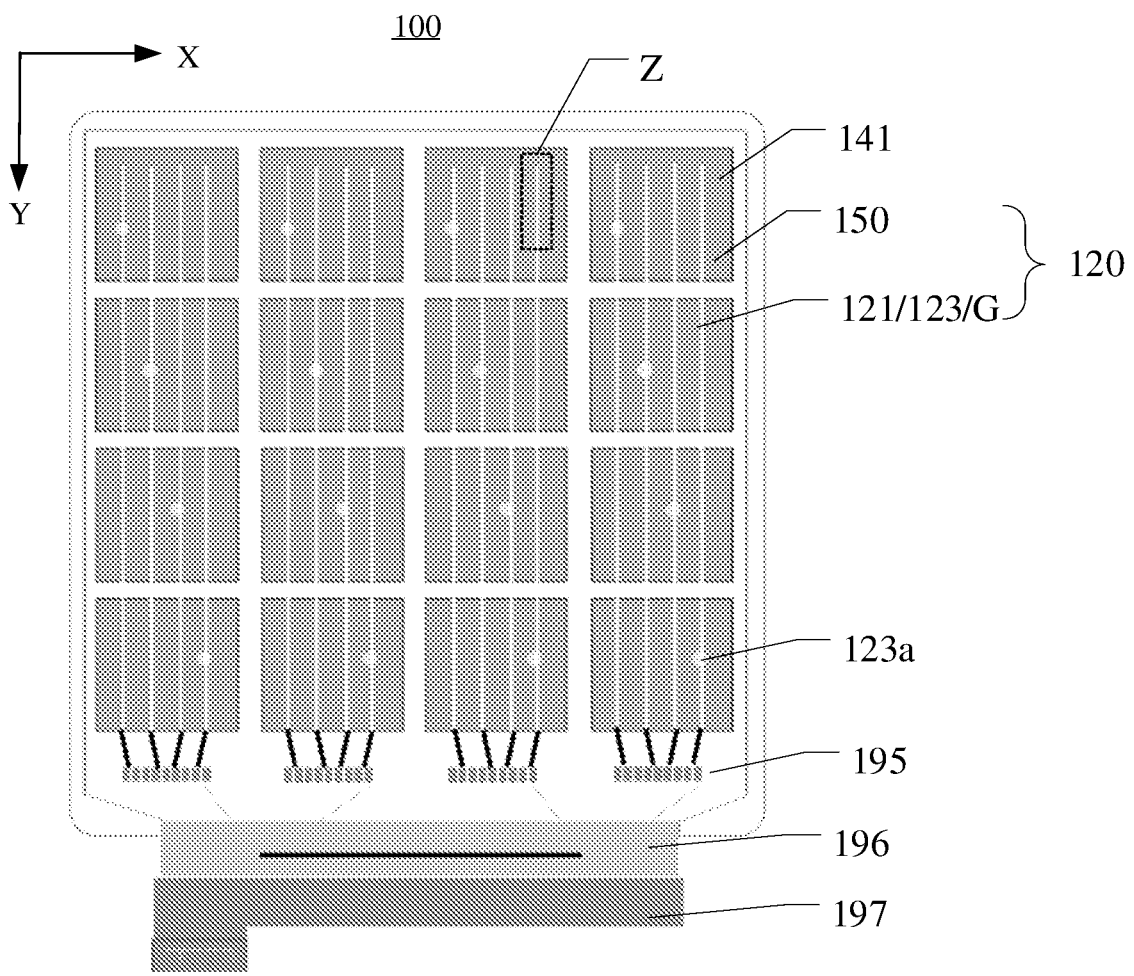
FIG. 9a is a schematic plan view of another touch display panel provided by an embodiment of the present disclosure.
Figure 9B:
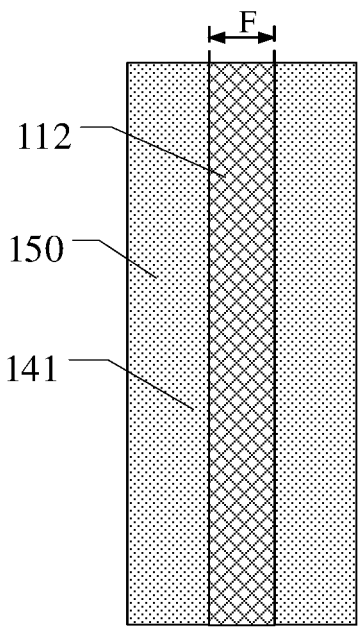

FIG. 9a is a schematic plan view of another touch display panel provided by an embodiment of the present disclosure; FIG. 9b is a partially enlarged schematic view of a dashed line region Z in FIG. 9a. As illustrated by FIG. 9a, a second conductive layer of the touch display panel 100 includes a plurality of touch electrodes 141 arranged in an array along a first direction X and a second direction Y. A first conductive layer of the touch display panel 100 includes a touch conductive structure 121, and the touch conductive structure 121 includes a plurality of touch signal lines 123 extending along the second direction Y. The plurality of touch signal lines 123 are arranged corresponding to the plurality of touch electrodes 141, and each touch signal line 123 is electrically connected with a corresponding touch electrode 141, for example, through a via hole 123a. A shielding conductive pattern 150 is located in the first conductive layer and insulated from the plurality of touch signal lines 123. As illustrated by FIG. 9b, an orthographic projection of the shielding conductive pattern 150 on the base substrate overlaps with an orthographic projection of the signal line 112 and an orthographic projection of at least one of the plurality of touch electrodes 141 on the base substrate, respectively, thereby realizing the shielding of the signal line 112 and the touch electrodes 141 by the shielding conductive pattern 150. Therefore, by arranging the shielding conductive pattern 150 on the first conductive layer, the shielding effect of the shielding conductive pattern 150 on the signal line 112 and the touch electrode 141 can be realized, the crosstalk between the signal line and the touch electrode can be reduced, the touch signal-to-noise ratio can be improved, and the display effect can be improved. There is no need to additionally add a dielectric layer and a photolithography process for separately manufacturing the shielding conductive pattern 150, so that the manufacturing cost and manufacturing cycle can be saved, the thickness of the touch display panel will not be increased, and the flexibility and variability of the touch display panel 100 is improved. Meanwhile, the shielding conductive pattern 150 insulated from the touch conductive structure 121 is arranged on the first conductive layer 120, which can further improve the metal visibility problems between the first conductive layer 120 and the second conductive layer 140, and further improve the display effect. It should be noted that, as illustrated by FIG. 9a, the shielding conductive pattern 150 and the touch signal line 123 are insulated adjacent to each other.

For example, as illustrated by FIGS. 9a and 9b, the orthographic projection of the signal line 112 on the base substrate and the orthographic projection of at least one of the plurality of touch electrodes 141 on the base substrate have an overlapping region F, and in the overlapping region F, the orthographic projection of the shielding conductive pattern 150 on the base substrate overlaps with the orthographic projection of the signal line 112 and the orthographic projection of the touch electrode 141 on the base substrate, respectively. Therefore, the shielding conductive pattern 150 can shield the signal line 112 and the touch electrode 141 in the overlapping region F the signal line 112 and the touch electrode 141, thereby better improving the shielding efficiency, and further improving the touch performance and display performance of the touch display panel 100.

For example, as illustrated by FIGS. 9a and 9b, the orthographic projection of the shielding conductive pattern 150 on the base substrate overlaps with the orthographic projection of the touch electrode 141 on the base substrate outside the above overlapping region F. Therefore, the shielding conductive pattern 150 can better shield the touch electrode 141 outside the overlapping region F, thereby improving the touch performance and display performance of the touch display panel 100.

For example, as illustrated by FIGS. 9a and 9b, the orthographic projection of the shielding conductive pattern 150 on the base substrate 111 can cover the orthographic projection of the signal line 112 and the orthographic projection of the touch electrode 141 on the base substrate 111 respectively in a width direction, so that the shielding effect of the shielding conductive pattern 150 on the signal line 112 and the touch electrode 141 can be better realized. It should be noted that the above-mentioned "width direction" refers to a direction perpendicular to an extending direction of the shielding conductive pattern 150.

For example, as illustrated by FIGS. 9a and 9b, there is a second overlapping region G between the orthographic projection of the plurality of touch signal lines 123 of the first conductive layer 120 on the base substrate and the orthographic projection of the plurality of touch electrodes 141 on the base substrate. Outside the second overlapping region G, the orthographic projection of the shielding conductive pattern 150 on the base substrate overlaps with the orthographic projection of the touch electrode 141 on the base substrate. Therefore, the shielding conductive pattern 150 can better shield the touch electrode 141 outside the second overlapping region G, thereby improving the touch performance and display performance of the touch display panel 100.

For example, as illustrated by FIGS. 9a and 9b, outside the second overlapping region G, the orthographic projection of the shielding conductive pattern 150 on the base substrate completely overlaps with the orthographic projection of the touch electrode 141 on the base substrate. Therefore, the shielding conductive pattern 150 can shield all the touch electrodes 141 in the touch display panel 100 except the second overlapping region G, so that the shielding of the shielding conductive pattern 150 on the touch electrodes 141 can be better realized.

For example, as illustrated by FIG. 9a, the shielding conductive pattern 150, the touch conductive structure 121 and the touch electrode 141 of the touch display panel 100 may be metal mesh structures as illustrated by FIGS. 5a to 5f and FIGS. 6a to 6e. Therefore, the touch display panel can have the technical effect corresponding to the technical effect of the metal mesh structure illustrated by FIGS. 5a to 5f and FIGS. 6a to 6e. For details, please refer to the related description of the above metal mesh, which is not repeated here.

For example, as illustrated by FIG. 9a, the touch display panel 100 further includes a plurality of pixel units, which are divided into a plurality of pixel groups, and each pixel group includes a plurality of pixel units. The pixel unit of the touch display panel 100 may be the pixel unit 1150 as illustrated by FIGS. 5h, 6g and 6h. Therefore, the number and arrangement of the pixel units of the touch display panel can be the pixel units 1150 as illustrated by FIGS. 5h, 6g and 6h. For details, please refer to the related descriptions of the pixel units mentioned above, which will not be repeated here.

For example, as illustrated by FIG. 9a, the touch display panel 100 may further include external driving circuits, such as a data selector circuit 195, a flexible printed circuit board 196, and a chip on film 197.

Figure 10:
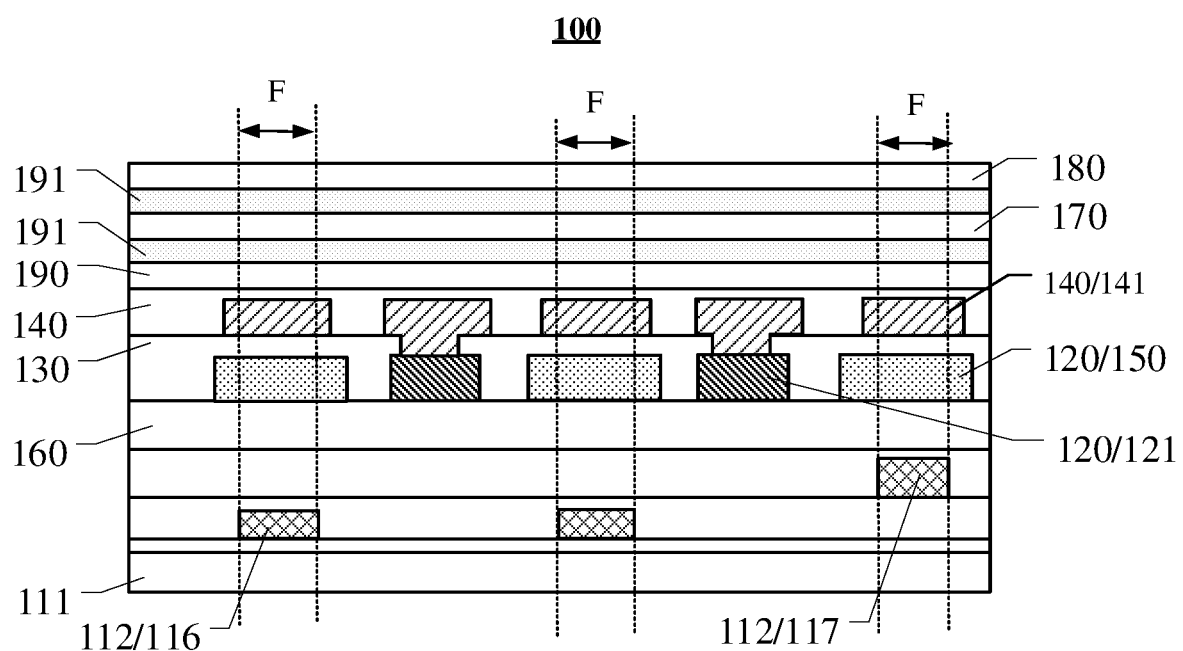
FIG. 10 is a schematic sectional view of another touch display panel provided by an embodiment of the present disclosure.

FIG. 10 is a schematic sectional view of another touch display panel provided by an embodiment of the present disclosure. As illustrated by FIG. 10, the touch display panel 100 further includes an encapsulation layer 160, an anti-reflective layer 170 and a cover plate 180. The encapsulation layer 160 is located between the display substrate and the first conductive layer 120; the anti-reflective layer 170 is located on a side of the second conductive layer 140 away from the display substrate. The cover plate 180 is located on a side of the anti-reflective layer 170 away from the display substrate.

For example, as illustrated by FIG. 10, the encapsulation layer 160 can be encapsulated with a thin film.

For example, a buffer layer may be formed on the encapsulation layer 160, and the first conductive layer 120 may be formed on the buffer layer.

For example, as illustrated by FIG. 10, the touch display panel 100 further includes an optical adhesive layer 190, which is located on a side of the second conductive layer 140 away from the base substrate 111. For example, a material of the optical adhesive layer 190 may include photoresist.

For example, as illustrated by FIG. 10, the touch display panel 100 further includes an optical adhesive 191 for bonding between the optical adhesive layer 190 and the anti-reflective layer 170, the anti-reflective layer 170 and the cover plate 180.

Figure 11:
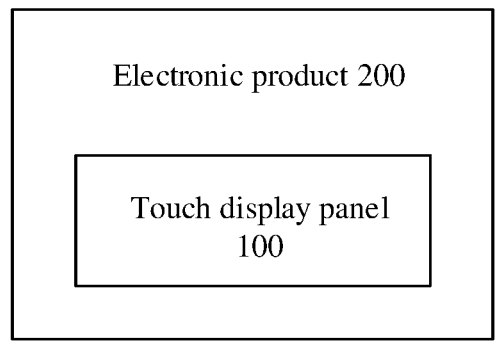
FIG. 11 is a schematic view of an electronic product provided by an embodiment of the present disclosure.

An embodiment of the present disclosure further provides an electronic product. FIG. 11 is a schematic view of an electronic product provided by an embodiment of the present disclosure. As illustrated by FIG. 11, the electronic product 200 includes the touch display panel 100 described above.

For example, the electronic product 200 can be a TV, a computer monitor, a notebook computer, a tablet computer, a smart phone, a navigator, an electronic picture frame, a vehicle display and other electronic products with touch display function.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other.

The above is only the specific embodiment of this disclosure, but the protection scope of the present disclosure is not limited thereto. Any person familiar with the technical field can easily think of changes or substitutions within the technical scope disclosed in the present disclosure, and they should be included in the protection scope of the present disclosure. Therefore, the scope of protection of the present disclosure should be based on the scope of protection of the claims.

The invention claimed is:

1. A touch display panel, including:
a display substrate, including:
a base substrate;
a signal line, located on the base substrate;
a first electrode layer, located on a side of the signal line away from the base substrate; and
a second electrode layer, located on a side of the first electrode layer away from the base substrate,
a first conductive layer, located on the display substrate;
a touch insulation layer, located on a side of the first conductive layer away from the display substrate; and
a second conductive layer, located on a side of the touch insulation layer away from the first conductive layer,
the first conductive layer includes a touch conductive structure, the second conductive layer includes a plurality of touch electrodes, the first electrode layer includes a plurality of first electrodes, and the second electrode layer includes a plurality of second electrodes;
the touch display panel further includes a shielding conductive pattern, an orthographic projection of the shielding conductive pattern on the base substrate overlaps with an orthographic projection of the signal line on the base substrate and an orthographic projection of at least one of the plurality of touch electrodes on the base substrate respectively,
the shielding conductive pattern is located in the first conductive layer and insulated from the touch conductive structure, or the shielding conductive pattern is located in the second electrode layer and insulated from the second electrode.

2. The touch display panel according to claim 1, the shielding conductive structure is located in the first conductive layer and insulated from the touch conductive structure,
the orthographic projection of the signal line on the base substrate and the orthographic projection of at least one of the plurality of touch electrodes on the base substrate have a first overlapping region,
in the first overlapping region, the orthographic projection of the shielding conductive pattern on the base substrate overlaps with the orthographic projection of the signal line on the base substrate and an orthographic projection of the plurality of touch electrodes on the base substrate respectively.

3. The touch display panel according to claim 2, outside the first overlapping region, the orthographic projection of the shielding conductive pattern on the base substrate overlaps with the orthographic projection of the plurality of touch electrodes on the base substrate.

4. The touch display panel according to claim 2, the orthographic projection of the touch conductive structure on the base substrate and the orthographic projection of at least one of the plurality of touch electrodes on the base substrate have a second overlapping region, outside the second overlapping region, the orthographic projection of the shielding conductive pattern on the base substrate completely overlaps with the orthographic projection of the plurality of touch electrodes on the base substrate.

5. The touch display panel according to claim 2, the shielding conductive pattern is a first metal mesh, including a first metal mesh line and a plurality of first hollows surrounded by the first metal mesh line;
the touch conductive structure is a second metal mesh, including a second metal mesh line and a plurality of second hollows surrounded by the second metal mesh line;
each of the plurality of touch electrode is a third metal mesh, including a third metal mesh line and a plurality of third hollows surrounded by the third metal mesh line.

6. The touch display panel according to claim 5, an orthographic projection of at least part of the first metal mesh line on the base substrate overlaps the orthographic projection of the signal line on the base substrate and an orthographic projection of the third metal mesh line of at least one of the plurality of touch electrodes on the base substrate respectively.

7. The touch display panel according to claim 6, the display substrate further includes a plurality of pixel units, and the first metal mesh line, the second metal mesh line and the third metal mesh line are arranged outside effective display regions of the plurality of pixel units.

8. The touch display panel according to claim 7, the plurality of pixel units are divided into a plurality of first pixel groups, and each of the plurality of first pixel groups includes one first pixel unit, one second pixel unit and one third pixel unit,
one first pixel group is arranged within the first hollow; and/or one first pixel group is arranged within the second hollow; and/or one first pixel group is arranged within the third hollow.

9. The touch display panel according to claim 8, the first pixel unit is configured to emit red light, the second pixel unit is configured to emit green light, and the third pixel unit is configured to emit blue light.

10. The touch display panel according to claim 7, the plurality of pixel units are divided into a plurality of second pixel groups, and each of the plurality of second pixel groups includes one first pixel unit, two second pixel units and one third pixel unit,
one second pixel group is arranged within the first hollow; and/or one second pixel group is arranged within the second hollow; and/or one second pixel group is arranged within the third hollow.

11. The touch display panel according to claim 7, each of the plurality of pixel unit includes:
- a pixel driving circuit, located on the base substrate; and
- a light emitting layer, located between the first electrode layer and the second electrode layer,
- the first electrode is an anode, the second electrode is a cathode, the signal line is configured to provide a driving signal to the pixel driving circuit, and the pixel driving circuit is electrically connected with the anode and configured to drive the light emitting layer to emit light.

12. The touch display panel according to claim 7, the signal line includes at least one selected from the group consisting of a gate line, a data line and a reset line.

13. The touch display panel according to claim 5, an orthographic projection of the first hollow on the base substrate is rectangular; and/or an orthographic projection of the second hollow on the base substrate is rectangular; and/or an orthographic projection of the third hollow on the base substrate is rectangular.

14. The touch display panel according to claim 5, the orthographic projection of the first hollow on the base substrate is hexagonal; and/or the orthographic projection of the second hollow on the base substrate is hexagonal; and/or the orthographic projection of the third hollow on the base substrate is hexagonal.

15. The touch display panel according to claim 1, the plurality of touch electrodes include a plurality of first touch electrodes and a plurality of second touch electrodes;
- the plurality of first touch electrodes are arranged along a first direction, each of the plurality of first touch electrode extends along a second direction intersecting with the first direction, and each of the plurality of first touch electrode includes a plurality of touch electrode portions arranged along the second direction and a connection portion positioned between two adjacent touch electrode portions;
- the plurality of second touch electrodes are arranged along the second direction, each of the plurality of second touch electrode includes a plurality of touch electrode blocks arranged along the first direction, and two adjacent touch electrode blocks in the first direction are electrically connected through the touch conductive structure.

16. The touch display panel according to claim 15, each of the touch electrode blocks and each of the touch electrode portions are both diamond-shaped metal meshes.

17. The touch display panel according to claim 1, the plurality of touch electrodes are arranged in an array along a first direction and a second direction;
- the touch conductive structure includes a plurality of touch signal lines, the plurality of touch signal lines are correspondingly arranged with the plurality of touch electrodes, and each of the plurality of touch signal line is electrically connected with a corresponding touch electrode.

18. The touch display panel according to claim 1, the shielding conductive pattern is located in the second electrode layer and insulated from the second electrode,
- the orthographic projection of the signal line on the base substrate and the orthographic projection of at least one of the plurality of touch electrodes on the base substrate have a third overlapping region,
- in the third overlapping region, the orthographic projection of the shielding conductive pattern on the base substrate overlaps with the orthographic projection of the signal line on the base substrate and an orthographic projection of the touch electrodes on the base substrate respectively.

19. The touch display panel according to claim 1, further including:
- an encapsulation layer, located between the display substrate and the first conductive layer;
- an anti-reflective layer, located on a side of the second conductive layer away from the display substrate; and
- a cover plate, located on a side of the anti-reflective layer away from the display substrate.

20. An electronic product, including the touch display panel according to claim 1.

* * * * *